US006847036B1

(12) United States Patent
Darling et al.

(10) Patent No.: US 6,847,036 B1
(45) Date of Patent: Jan. 25, 2005

(54) CHARGED PARTICLE BEAM DETECTION SYSTEM

(75) Inventors: Robert Bruce Darling, Seattle, WA (US); Adi A. Scheidemann, Seattle, WA (US); Frank J. Schumacher IV, Fall City, WA (US); Patrick L. Jones, Seattle, WA (US)

(73) Assignee: University of Washington, Seattle, WA (US)

( * ) Notice: Subject to any disclaimer, the term of this patent is extended or adjusted under 35 U.S.C. 154(b) by 0 days.

(21) Appl. No.: 09/744,360

(22) PCT Filed: Oct. 6, 1999

(86) PCT No.: PCT/US99/23307

§ 371 (c)(1),
(2), (4) Date: Jan. 22, 2001

(87) PCT Pub. No.: WO00/20851

PCT Pub. Date: Apr. 13, 2000

Related U.S. Application Data

(60) Provisional application No. 60/116,710, filed on Jan. 22, 1999.

(51) Int. Cl.[7] .................................................. H01J 37/04

(52) U.S. Cl. .................... 250/291; 250/397; 250/396 R

(58) Field of Search ................................ 250/291, 397, 250/396 R

(56) References Cited

U.S. PATENT DOCUMENTS 4,290,012 A 9/1981 Berte et al.
4,608,493 A * 8/1986 Hayafuji ..................... 250/397
4,700,131 A * 10/1987 Miller .................... 324/117 H
4,724,324 A 2/1988 Liebert
4,800,100 A * 1/1989 Herbots et al. ............. 427/527
4,973,840 A 11/1990 Srivastava
4,992,742 A 2/1991 Okuda et al.
5,198,676 A 3/1993 Benveniste et al.
6,020,592 A * 2/2000 Liebert et al. ......... 250/492.21

OTHER PUBLICATIONS

Natsuaki, N., et al., "Spatial Dose Uniformity Monitor for Electrically Scanned Ion Beam," *Rev. Sci. Instrum. 49*(9):1300–1304, Sep. 1978.

O'Morain, C., et al., "Large–Diameter Plasma Profile Monitoring System Using Faraday Cup and Langmuir Probe Arrays," *Meas. Sci. Technol. 4*:1484–1488, Dec. 1993.

Scheidemann, A.A. et al., "Linear Dispersion Mass Spectrometer," *Proceedings of the 47th American Society for Mass Spectrometry Conference on Mass Spectrometry and Allied Topics*, Dallas, Texas, Jun. 1999.

* cited by examiner

*Primary Examiner*—John R. Lee
*Assistant Examiner*—Anthony Quash
(74) *Attorney, Agent, or Firm*—Christensen O'Connor Johnson Kindness PLLC

(57) ABSTRACT

A charged particle beam detection system (10) that includes a Faraday cup detector array (FCDA) for position-sensitive charged particle beam detection is described. The FCDA is combined with an electronic multiplexing unit (MUX) (2) that allows collecting and intgrating the charge deposited in the array, and simultaneously reading out the same. The duty cycle for collecting the ions is greater than 98%. This multiplexing (2) is achieved by collecting the charge with a large number of small and electronically decoupled Faraday cups. Because Faraday cups collect the charge independent of their charge state, each cup is both a collector and an integrator. The ability of the Faraday cup to integrate the charge, in combination with the electronic multiplexing unit (2), which reads out and empties the cups quickly compared to the charge integration time, provides the almost perfect duty cycle for this position-sensitive charged particle detector (10). The device (10) measures further absolute ion currents, has a wide dynamic range from 1.7 pA to 1.2 μA with a crosstalk of less than 750:1. The integration of the electronic multiplexing unit (2) with the FCDA further allows reducing the number of feedthroughs that are needed to operate the detector (10).

30 Claims, 16 Drawing Sheets

CHARGED PARTICLE BEAM DETECTION SYSTEM

This application claims benefit of Provisional application Ser. No. 60/116,710 filed Jan. 22, 1999.

FIELD OF THE INVENTION

The present invention relates in general to a charged particle beam detection system and, in particular, to a Faraday cup detector array useful in mass spectrometry.

BACKGROUND OF THE INVENTION

The inner walls of any metallic body are free of charge and electrostatic fields. Therefore, if a charged particle external to a metallic cup hits the inside of the cup and is neutralized there, the accumulated charge will flow to the outer surface of the cup. This implies that it is possible to achieve a very high charge state of the cup by depositing charge on the inside of the cup, because no potential needs to be overcome by the approaching charge. This is the working principle of a Faraday cup detector. A charged particle beam enters the cup. The particle collides with the cup wall and is neutralized as the charge is transferred to the cup. In the case of a charged particle, the now neutral atom (or molecule) may leave or stay in the cup, depending on the sticking coefficient and cup temperature. At some point in time, before the charge can leak away by other means, the charge accumulated on the cup is measured by draining away the charge through a suitable circuit.

In practice, incoming particles with energies above approximately 300 eV may invoke sputtering on the cup surface during the collision with the cup wall. In this case secondary electrons or ions are created. These secondary charged particles may leave the cup, thus altering the net balance between the charge accumulated on the cup and the incoming charge flux. These secondary particles leave the surface of the cup with only low energy and thus can be retained in the cup by creating a retarding electric field with a low voltage. Such a low potential has little effect on the incident charged particle beam. Placing a suppressor grid or electrode with an appropriate voltage in front of the entrance to the cup typically creates the retarding electric fields in Faraday cup designs. These designs trade transmission into the cup for better retention of the charge that enters. The trade-off is necessary because of the difficulty in manufacturing cups by standard means with small opening cross-sectional dimensions and large depths that would allow for effective use of simple biasing.

In combination with conventional electrometers, well-designed Faraday cups can measure charged particle currents down to $I=10^{-14}$ A, representing the charge on about 50,000 ions. Therefore, Faraday cups are not as sensitive as electron multipliers or microchannel plate detectors, which have single charged particle counting capabilities. The Faraday cup's main advantages include its extreme robustness and reliability, and its linearity and capability for measuring absolute ion currents. In addition, Faraday cups are charge-integrating devices that offer the potential for use in applications requiring the capturing of charge with ratios of the time charge is measured to the time available (duty cycle) approaching unity. Unlike devices depending upon charge cascades for gain, the operating principle of Faraday cups does not require high voltages. As a result, Faraday cups will not catastrophically break down, or induce spurious ionization, if the operating environment is not a high vacuum. In fact, they work independently of the vacuum conditions of the experimental layout and can even be used under atmospheric conditions. These features make Faraday cups an integral part of many instruments that require charged particle detection under less than ideal conditions.

Faraday cup detector arrays (FCDA) have been developed to measure the spatial distribution of ions or electrons in ion implantation applications (R. B. Liebert, "Method and Apparatus for Ion Beam Centroid Location," U.S. Pat. No. 4,724,324, Feb. 9, 1988; M. Berte et al., "Device for Quantitative Display of the Current Density Within a Charged-Particle Beam", U.S. Pat. No. 4,290,012, Nov. 5, 1979; S. Okuda et al., "Charged-Particle Distribution Measuring Apparatus", U.S. Pat. No. 4,992,742, Nov. 15, 1989; V. M. Benveniste et al. "Ion Beam Profiling Method and Apparatus", U.S. Pat. No. 5,198,676, Mar. 30, 1993. C.

O'Morain, et al., "Large Diameter Plasma Profile Monitoring Using Faraday Cup Arrays," *Meas. Sci. Tech.*, Vol. 4, pp. 1484–1488, 1993; N. Natsuaki, et al., "Spatial Dose Uniformity Monitor for Electrically Scanned Beam," *Rev. Sci. Instrum.*, Vol. 49, No. 9, pp. 1300–1304, September 1978.). Such a measurement has a resolution dependent on the finite size of each cup, the distance between adjacent cups in any dimension, and the width of the insulator between cups. A wide range of sizes can be, and have been, realized. Typically, designs do not consider ease, cost, and speed of manufacture, since they are for specialized applications, such as measuring beam profiles in experimental apparatuses or very high-cost electron microscopes.

Monitoring spatial distributions of charged particle beams is possible with several technologies, such as position-sensitive, microchannel-plate detectors (MCP), MCP-phosphorous screen units, or charge-coupled devices (CCD). These technologies are tailored to high sensitivity and provide the ability to count even single ions. However, they all lack linearity, ruggedness, and their amplification characteristics degrade over time. Furthermore, these devices cannot measure absolute ion currents if they are not particle counting, and are of only limited use in poor vacuum conditions, as found in the next generation of miniaturized mass spectrometers, such as portable or spacecraft-based instruments (M. P. Shiha, et al., "Development of a Miniature Gas Chromatograph—Mass Spectrometer," *Anal. Chem.* Vol. 63 (18) pp. 2012–2016 (1991)). Finally, these solutions are cost intensive.

Faraday cup arrays have been developed for ion beam profiling purposes, but have been too large to be of use if high resolution is desired. (See above references.) They have been designed to provide spatial profiling of intense currents of a single type of charged particle. Device designers have given little or no attention to the requirements of measuring multiple ion currents covering a wide dynamic range beginning at low intensities and requiring high spatial resolution, such as would be seen in many mass spectrometric applications. Neither have designers been concerned with the speed of reading the array. Because applications have been specialized, present devices have not combined the previous requirements with the additional ones of ease, cost, and speed of manufacture.

The present invention addresses the key features that must be present in order for such a detector array to be useful and practical in applications other than the measurement of intense ion or electron beams, such as use as a detector in a Herzog-Mattuch type of mass spectrometer. The FCDA itself must have a fine pitch, typically of less than a millimeter from cup to cup, and it must be scalable up to several hundred cups in a linear array. The cups must intercept as much as possible of the incident charged particle beam, producing a high fill factor (ratio of sensitive detection area to the total area of the detector array). The cups and their interconnections to the electronic circuitry must be low leakage paths with controlled parasitic capacitances, with particular attention paid to minimizing the cup-to-cup capacitance, which increases as the overall array is miniaturized. The cups must also exhibit a high aspect ratio, being much deeper than wide in order to properly trap incident ions and suppress the emission of secondary electrons. Further, the FCDA must be tightly integrated with the electronic multiplexing unit (MUX) to produce a system that can be integrated into a vacuum chamber with only a minimal number of electrical feedthroughs. The multiplexing circuitry should be placed very close to the FCDA itself to minimize interference problems and maximize the signal-to-noise ratio (SNR). Crosstalk between cups and switching artifacts must also be reduced to a minimum in order to achieve full low-noise, high-sensitivity multichannel detection.

The present invention provides a charged particle beam detection system that includes a Faraday cup detector array (FCDA) and a tightly integrated electronic multiplexing unit (MUX). The FCDA of the invention has a variety of embodiments, several of which utilize modern microfabrication techniques and materials to realize all of the above features in a compact and economical design.

SUMMARY OF THE INVENTION

The present invention provides a Faraday cup detector array (FCDA) for charged particle beam detection. The detector being an array of Faraday cups means that the detector is position sensitive. By combining the FCDA with an electronic multiplexing unit (MUX), the present invention provides a charged particle beam detection system.

Embedding the Faraday cups in a (grounded) conducting housing, provides a small cup-to-cup capacity, which, by combining the FCDA with an electronic multiplexing unit based on a Gray-code, has then the unique capability to monitor the entire array simultaneously with a duty cycle >98%, and having a crosstalk level better than 750:1, despite the fact that the Faraday cups are packed densely.

Therefore, a large fill factor (defined as the ratio of the "active opening area" to the "overall size of the detector array") can be achieved.

Embodiments of the charged particle beam detection system of the invention include a variety of FCDA designs, all of which include electronically isolated Faraday cups (i.e., individual Faraday cups isolated by grounded walls), and are within the scope of the invention. These detector arrays can be connected to an electronic interface that multiplexes the array readout using an operational amplifier integrator system. The multiplexer interface uses a Gray-code sequencing to eliminate switching artifacts that would otherwise arise from a cascaded multiplexing scheme that is needed to address upwards of several hundred array elements.

To combine the actual detector array with the electronic interface and the amplifier to one unit provides high signal-to-noise ratios, small crosstalk, and high readout speeds.

Representative embodiments of the charged particle beam detection system (the FCDA-MUX unit) include the following four embodiments:

a) a two-dimensional FCDA built in an anodized aluminum matrix, the insulating wall thickness is smaller than 0.002 inch, the copper wall of the cup is 0.001 inch, the pitch size is 0.1 inch and the diameter of the cup is 0.087 inch (see FIGS. 2A, 2B, 2C);

b) a linear FCDA composed of stacked plates, each cup is separated by a grounded wall from its neighboring cup, the active area has an opening of 5 mm×700 μm, with a total wall thickness of 120 μm (see FIG. 3);

c) a linear microfabricated FCDA manufactured by LIGA technology E. W. Becker, "Fabrication of Microstructure with High Aspect Ratio and Great Structural Highest by Synchrotron Radiation, Lithography, Galvoumformung, and Plastic Molding (LIGA process)", *Microelectronic Engineering*, May 1986, Vol. 4(1), 35–56. (See FIG. 4.) Dimensions 250 mm×250 μm wide, 2500 μm×depth 750 μm; and d) a linear array of microfabricated Faraday cups manufactured by DRIE technology (see FIG. 5) (D. A. Baglee, et al., "Properties of Trench Capacitors for High Density DRAM Applications," *IEDM Tech. Digest*, pp. 384–387, December 1985.).

As noted above, all of the FCDA designs can be interfaced with an electronic multiplexing unit to provide a charged particle beam detection system (see FIG. 6).

In one aspect, the present invention provides a Faraday cup detector array that is a charged particle beam monitor having the following characteristics:

(1) position sensitive with a resolution of 0.82 mm and scalability down to 150 μm;

(2) each individual Faraday cup is capable of integrating the charge independent of the other cups;

(3) the FCDA measures absolute charged particle currents without the use of secondary particle suppressor grids or electrodes;

(4) the FCDA has a wide dynamic range, the current range from 1.7 pA to 1.2 μA has been demonstrated;

(5) the FCDA is vacuum independent and works in an air atmosphere;

(6) the FCDA is robust and has no serviceable parts;

(7) the FCDA has a nearly 100% duty cycle and a readout speed from 0 to 100 kHz; and (8) because the FCDA is scalable, low cost MEMS manufacturing methods can be applied to build a high-resolution FCDA.

In another aspect of the invention, a FCDA-MUX-integrating amplifier is provided. The FCDA-MUX-integrating amplifier offers the following advantages including:

(1) a reduction in the number of output lines, for example, only 5 vacuum feedthroughs are needed to read out a FCDA with 64 or 256 units;

(2) a single integrator-amplifier for the array guaranteeing uniform amplification across the entire array;

(3) an integrator unit that averages the noise (e.g., white noise), thus significantly reducing its contribution; and (4) an integrating sample and hold circuit that simplifies the data acquisition significantly such that computer data acquisition has to match only the clock of the readout frequency rather than fast charge integration.

The FCDA-MUX unit, can be used as a low-cost position-sensitive readout mechanism for a MCP-FCDA-MUX-integrator unit.

The present invention employs the advantages of a Faraday cup to a fine spatial distribution measurement of an ion or electron beam. The present invention provides a FCDA and its electronic interface that is both a platform for a 250

μm resolution device and a low-cost method for position-sensitive particle detection. The device employs the advantages of a Faraday cup with a spatial resolution ranging from 250 mm to 0.1 inch and can be interfaced with data acquisition electronics. Such a configuration simplifies the use of array technology because only six feedthroughs are needed to read out the array, and most of the electronics are integrated with the system. Furthermore, the invention provides a low-cost method to produce long arrays of Faraday cup units, which are useful in devices such as mass spectrometers of the Herzog-Mattuch design where the ions are mass separated spatially in a focal plane. T. W. Burgoyne, et al. "Design and performance of a plasma-source mass spectrograph", *J. Am. Soc. Mass Spectrometry*, Vol. 8, 307–318, 1997. Thus, in another embodiment, the invention provides a microfabricated FCDA that has very high spatial resolution. The microfabricated FCDA can be manufactured at low cost and in high volume as seen in MEMS technology.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein:

FIG. 2A is a cross-sectional view showing 8 Faraday cups in the aluminum matrix; FIG. 2B is a close up view of FIG. 2A to show the details of the array design, and FIG. 2C is a top view of a possible close packed layout;

FIG. 8A shows the ion current measured with the exposed cup, FIG. 8B demonstrates the low crosstalk by magnifying the readout scale in order to display the base line;

DETAILED DESCRIPTION OF THE PREFERRED EMBODIMENT

Figure 1:
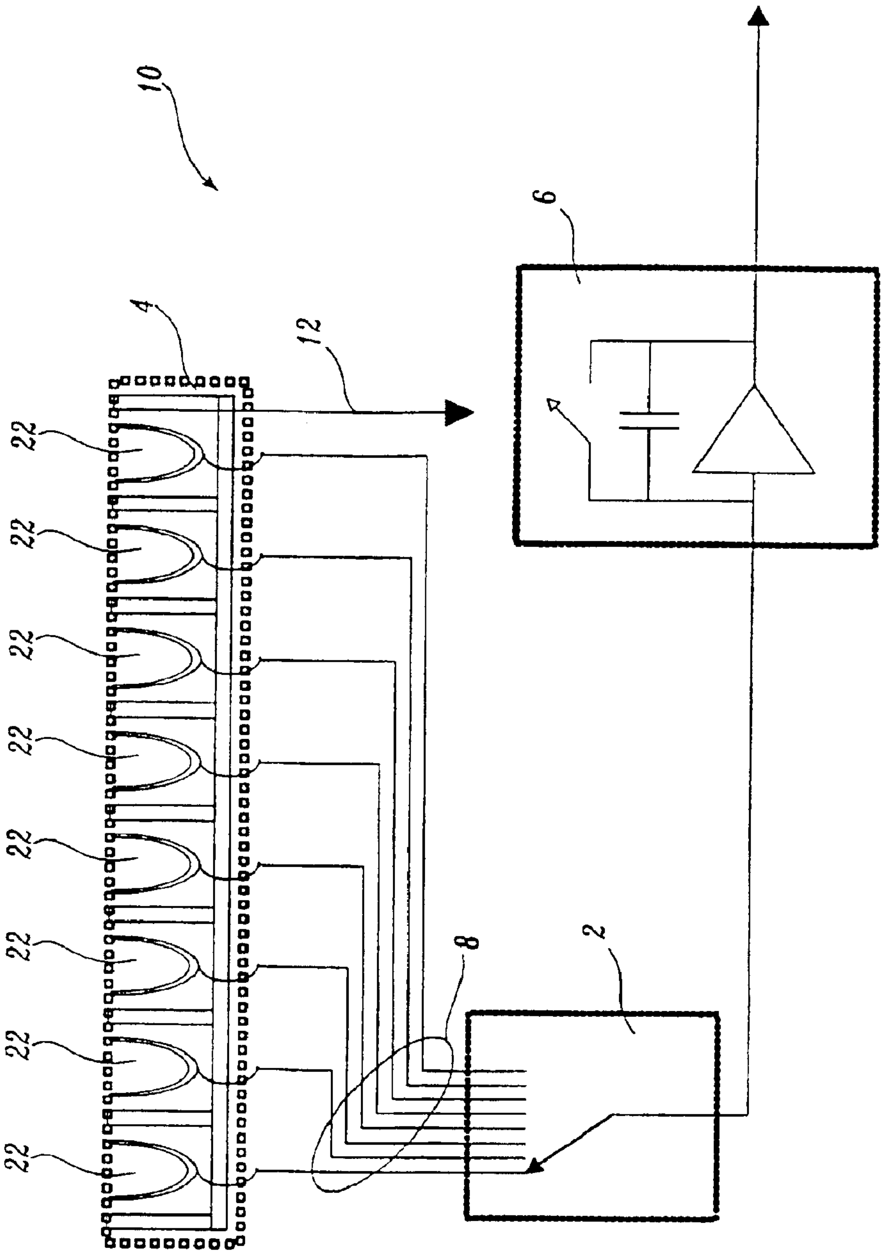
FIG. 1 is a schematic illustration of a representative charged particle beam detection system of the invention having a Faraday cup detector electronically interfaced to the multiplexing unit and operational amplifier.

The present invention provides a Faraday cup detector array FCDA) for charged particle beam detection. The detector being an array of Faraday cups means that the detector is position sensitive. By combining the FCDA with a properly synchronized electronic multiplexing unit (MUX, the resulting instrument has the unique capability to simultaneously monitor the entire array of Faraday cups with a duty cycle approaching 100%. The high duty cycle is achieved by collecting the ions with a large number of small, electronically decoupled Faraday cups. Because Faraday cups collect incident ions independent of their charge state, each cup is both a charged particle collector and a charge integrator. The ability of a Faraday cup to integrate the charge, in combination with the electronic multiplexing unit, which quickly reads out (and empties) the cups compared to the charge integration time of the array, provides the almost perfect duty cycle for such position-sensitive charged particle detection.

Faraday cups traditionally provide for absolute measurements of ion currents with wide dynamic range. Arrays of Faraday cups are attractive for position-sensitive detection of ions for purposes of ion beam profiling or for sensitive chemical analysis methods, such as mass spectrometry. However, several key features must be present in order for such a detector array to be useful and practical. The FCDA itself must have a fine pitch, typically of less than a millimeter from cup to cup, and it must be scalable up to several hundred cups in a linear array. The cups must intercept as much as possible of the incident ion beam, producing a high fill factor (ratio of sensitive detection area to the total area of the detector array). The cups and their interconnections to the electronic circuitry must be low leakage paths with controlled parasitic capacitances, with particular attention paid to minimizing the cup-to-cup capacitance, which increases as the overall array is miniaturized. The cups must also exhibit a high aspect ratio, being much deeper than wide, in order to properly trap incident ions and suppress the emission of secondary electrons. Further, the FCDA must be tightly integrated with the electronic multiplexing unit (MUX) to produce a system that can be integrated into a vacuum chamber with only a minimal number of electrical feedthroughs. The multiplexing circuitry should be placed very close to the FCDA itself to minimize interference problems and maximize the signal-to-noise ratio (SNR). Crosstalk between cups and switching artifacts must also be reduced to a minimum in order to achieve full low-noise, high-sensitivity multichannel detection.

The present invention thus comprises a Faraday cup detector array (FCDA) and a tightly integrated electronic multiplexing unit (MUX). The described system is scalable from hundreds to thousands of cups in the array. The features that are common to all FCDA and MUX embodiments are discussed first, and then four representative classes of FCDA embodiments are described that achieve the high level of required performance by exploiting modern microfabrication techniques and materials.

Generic FCDA. As shown in FIG. 1, the generic FCDA comprises a set of conductive electrodes that are supported on a common insulating substrate that locates each in a permanent and regular position with respect to its neighbors. The cups are each fabricated to have a high aspect ratio, being generally deeper than they are wide. This high aspect ratio helps the Faraday cup to trap incident ions without producing excessive backscatter of sputtered ions or secondary electrons. Ions incident upon the array at oblique angles will tend to reflect downward into the cups and become trapped there, losing energy and momentum on each collision with the cup walls. The cups are engineered to provide a constant and repeatable capacitance to ground, while minimizing any capacitance between the adjacent cups. This parasitic cup-to-cup capacitance increases rapidly as the detector array is miniaturized and can dominate over the cup-to-ground capacitance if the FCDA is not properly constructed. The cup-to-cup capacitance is minimized and the cup-to-ground capacitance is maximized by the use of a grounded conductive separator that is placed between each adjacent pair of cups. This provides electrostatic shielding for each cup from its neighbors and increases the effective capacitance of each cup with respect to ground. The walls of each cup, the intervening dielectric, and the grounded separators are designed to be as thin as possible, preferably being only a small fraction of the overall detector pitch. This condition produces a high fill factor, allowing the active area of the detector to become 60 to 80 percent of the overall array area. The dielectric that separates each cup from its neighbors and the grounded separators is a very low-leakage, high-breakdown-strength material.

The generic electronic multiplexing unit (MUX) is also illustrated schematically in FIG. 1. This system comprises a set of analog switch multiplexer chips, an integrating operational amplifier with sample-and-hold (S/H) output, a master clock oscillator, and timing circuits to synchronize the operation of the MUX to that of a controlling personal computer (PC). Analog multiplexing is accomplished through the use of standard 8:1 or 16:1 multiplexer chips, which are cascaded into 2 or 3 levels to produce an overall 64:1, 128:1, 256:1, 512:1, or in general $2^n$:1 multiplexing of the cups into a single line that is input to the integrator. Low-leakage analog switches are used, preferably MOSFET type with oxide isolation to keep leakage levels down to only a few picoamperes.

Because 2 or 3 levels of analog multiplexing are required to address up to several hundred individual Faraday cups, switching artifacts are often produced when two or more switches change state with a slight time skew between them. The present invention eliminates this problem through the use of a Gray-code sequence generator that is implemented in a Generic Array Logic (GAL) programmable chip. This architecture sequences the scan through the cups in a manner whereby only one switch changes state on each increment, thus keeping any charge injection constant during the entirety of the scan. The wiring of the cups to the analog switch multiplexing chips reverses the Gray-code sequencing, thereby making the overall internal switch sequencing invisible to the other parts of the circuit.

A master clock oscillator drives the synchronous circuitry of the GAL which sequences the analog switch multiplexers to connect only one Faraday cup at a time to the input of the integrating operational amplifier. The unconnected analog multiplexer chips are disabled by a separate Gray-coded address to their chip select pins. When each cup becomes connected to the input of the integrator, it is discharged to zero and its collected charge is transferred to the integration capacitor where it is held while the PC card performs an analog-to-digital conversion. This occurs once for each cup over the whole scan, and since the discharge time for each cup is very small compared to the overall duration of the array scan, each Faraday cup integrates the incoming ion flux with a duty cycle of (N-1)/N, where N is the number of cups in the array. This allows extremely high duty cycles to be obtained, approaching 100 percent, which gives the system a sensitivity improvement factor of approximately N over scanned single-channel ion detectors (such as quadrupole detectors). For sensitive chemical analysis methods where the initial sample is very small, it is very important to not waste any incident ion flux. The present invention collects nearly all of the incident ions and thereby obtains a much higher sensitivity over competing ion detection systems by providing true multichannel detection.

Modern microfabrication methods and materials can be exploited to produce several different embodiments of the FCDA that satisfy all of the previously mentioned design elements. Four such embodiments are next specifically described in detail and include: an anodized aluminum array that is produced by precision machining; a linear array that is produced by compression stacking of precision cut laminates or shims; a microfabricated array that is produced by high aspect ratio template electroplating (LIGA); and a microfabricated array in silicon that is produced by deep reactive ion etching (DRIE) and which is compatible with other silicon IC processes.

Anodized aluminum EDM FCDA. In this embodiment, deep holes are machined into an aluminum block to create the Faraday cups. The block is separated into individual cups by electric discharge machining (EDM) or other precision machining methods. The aluminum is anodized to form a layer of aluminum oxide ($Al_2O_3$ or alumina), which forms an extremely stable and low-loss insulator. The separator (the aluminum block) is then grounded. This embodiment can be mounted directly on top of a printed circuit board (PCB), as shown in FIG. 2, from which the printed wiring of the board contacts the proper cups in the array and the whole system of FCDA and MUX can be built upon a single PCB. This embodiment can be used to produce both linear (one-dimensional) and areal (two-dimensional) detector arrays.

The anodized aluminum embodiment of FIG. 2 is an 8×8 areal array with a cup pitch of 2.54 mm, a cup diameter of 2.2 mm, and a cup depth of 9.2 mm. The individual Faraday cup is built in a hard-anodized aluminum block. The cup itself is made from rolled copper foil (0.001 inch thick). The aluminum block (containing the cups) is bonded onto a fiberglass reinforced, epoxy filled PC board, which also contains the electronic multiplexer and readout circuitry. This allows the walls and bottom of the Faraday cups to be soldered to the vias/traces of the PC board to form the electrical connections. This layout provides a 20 pF cup-to-ground capacitance and a very low cup-to-cup capacitance of less than 2 pF. The cup to ground capacity is increased to 1.22 nF with the use of an external capacitor. Further, no wires are needed for the electrical connection of the FCDA to the electronic multiplexer on the PC board. A stainless steel mask on the top of the aluminum block prevents the charged particle beam from impacting the anodized surface of the aluminum block and creating space charge. The stainless steel mask provides a suppression grid (Buckbee-Mears Corp., St. Paul, 90% transmission).

Figure 3:
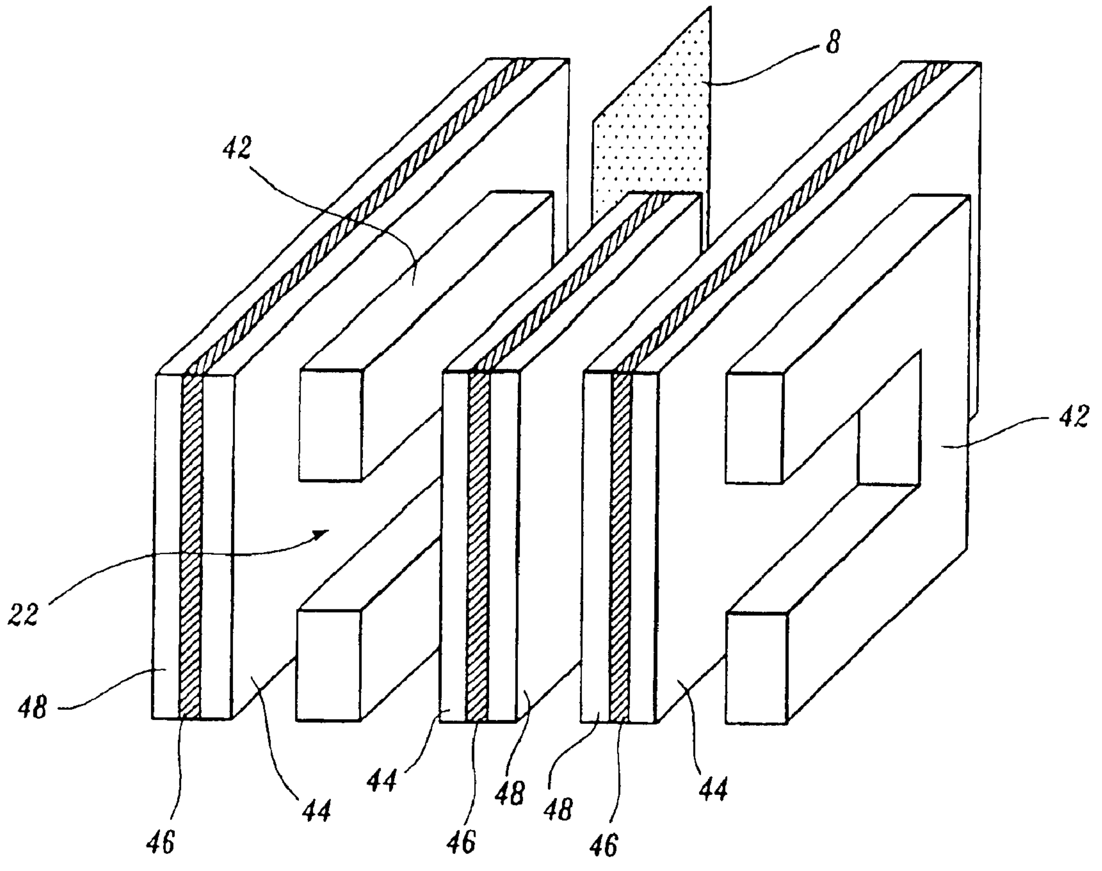
FIG. 3 is an illustration of the individual components of a representative linear Faraday cup useful in the FCDA of the invention.

Stacked laminate FCDA. A linear, one-dimensional FCDA can be assembled in a sandwich fashion by compressing various precision cut laminates and shims together into a stack. Each cup unit cell is composed of two copper-clad insulating walls separated by a U-shaped copper plate. By sandwiching the U-shaped copper plate from both sides with a copper/fiberglass/copper (CFC) sheet, a 1.4 μm thick copper wall is formed for the Faraday cup. These components are illustrated in FIG. 3. By using commercially available copper-clad circuit board material, electrical insulation and a ground plane between each unit are achieved as shown in FIG. 3. The CFC plates left and right of the copper center plate may have different heights to facilitate the connections for the output signal and grounding. Representative 128-unit and 256-unit cells have been formed by mounting the cells into an electrically insulated aluminum housing. The cups are connected with individual wires to the electronic MUX interface. In this case, the invention provides a 128-unit FCDA with a unit cell pitch of 820 μm (0.82 mm). Each cell consists of an active area of 700 μm×5 μm, and the remaining 120 μm consists of sidewalls, insulating material (fiberglass), and ground planes. Therefore, each unit cell has a total width of 820 μm. In another similar embodiment, a 256-unit FCDA was fabricated and tested.

LIGA Microfabricated FCDA. The previously described FCDA has a cup width of 700 μm with a cup wall thickness of 1.4 μm. This system proved the working principle of the concept of the invention. Because electrostatic forces, which govern the characteristics of Faraday cups, scale well down into the submicron regime, it is reasonable to assume that the existing system can be scaled to cup sizes of less than 100 μm. The scaling laws would, however, forbid scaling to the nanometer size regime where quantum effects, such as tunneling, need to be addressed. This size regime is at least 100 times smaller than the presently envisioned dimensions of the FCDA.

A microfabricated Faraday cup array (MFCA) fully realizes the benefits of the FCDA-MUX system. There are several approaches for the microfabrication of this detector array. In one embodiment, a representative MFCA was produced by the lithographie-galvanoformung-abformung (LIGA) process at MEMSTEK Products, LLC, and is shown in FIG. 4, based upon synchrotron x-ray photolithographic exposure and subsequent template electroplating of nickel to form the cups and electrostatic spacers. This high-aspect ratio micromachining (HARM) process produces nearly vertical sidewalls in the nickel, which are needed for proper charged particle trapping. The detector pitch for this array was varied between 150 μm and 250 μm, and was achieved using a nominal wall thickness of 10 μm with 10 μm air gaps in between. Fill factors of 67 to 80 percent were achieved with cup depths of 250 μm. The lateral air (or vacuum) gaps also serve to reduce the cup-to-cup capacitances even further, due to the lower dielectric constant of air or vacuum over other insulators. The all metal construction of these cups also allows for high-temperature operation and bake-out capability. The internal bottom of the cups is also created from a nickel layer, which is a patterned plating base for the vertical parts of the structure.

Figure 5:
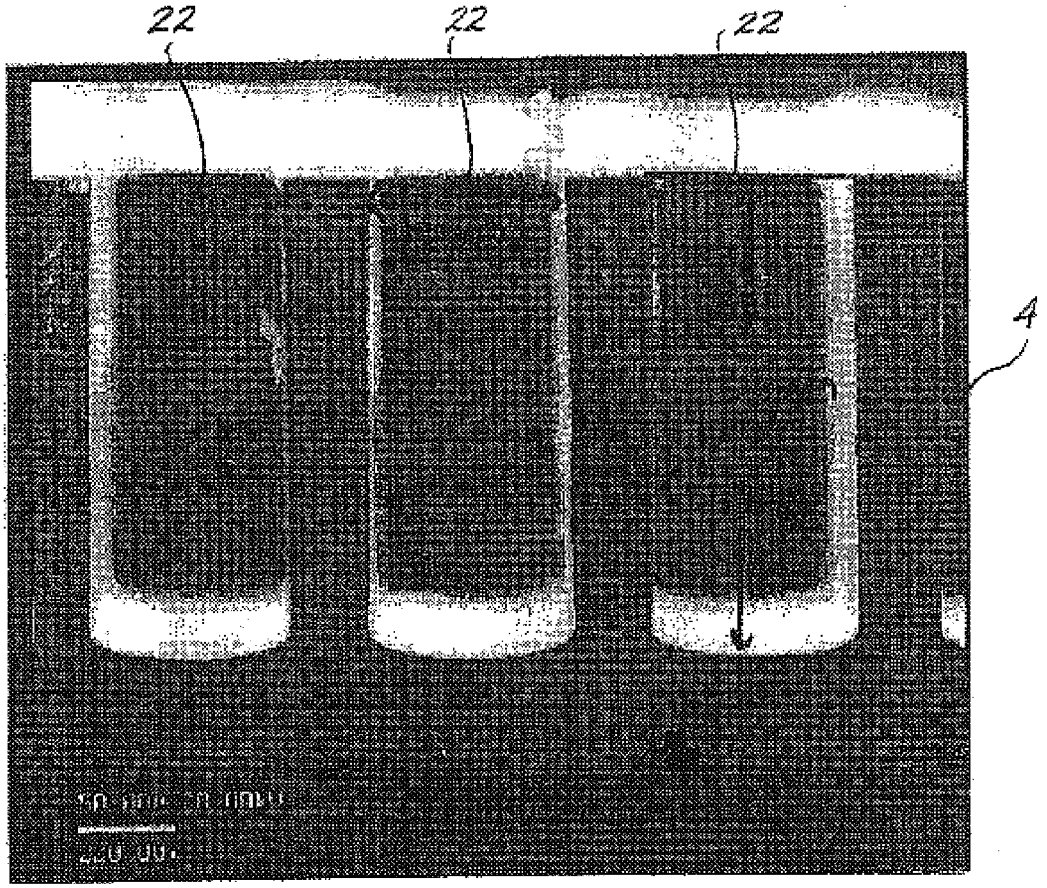
FIG. 5 is an image of a representative microfabricated FCDA using DRIE technology.
Figure 6:
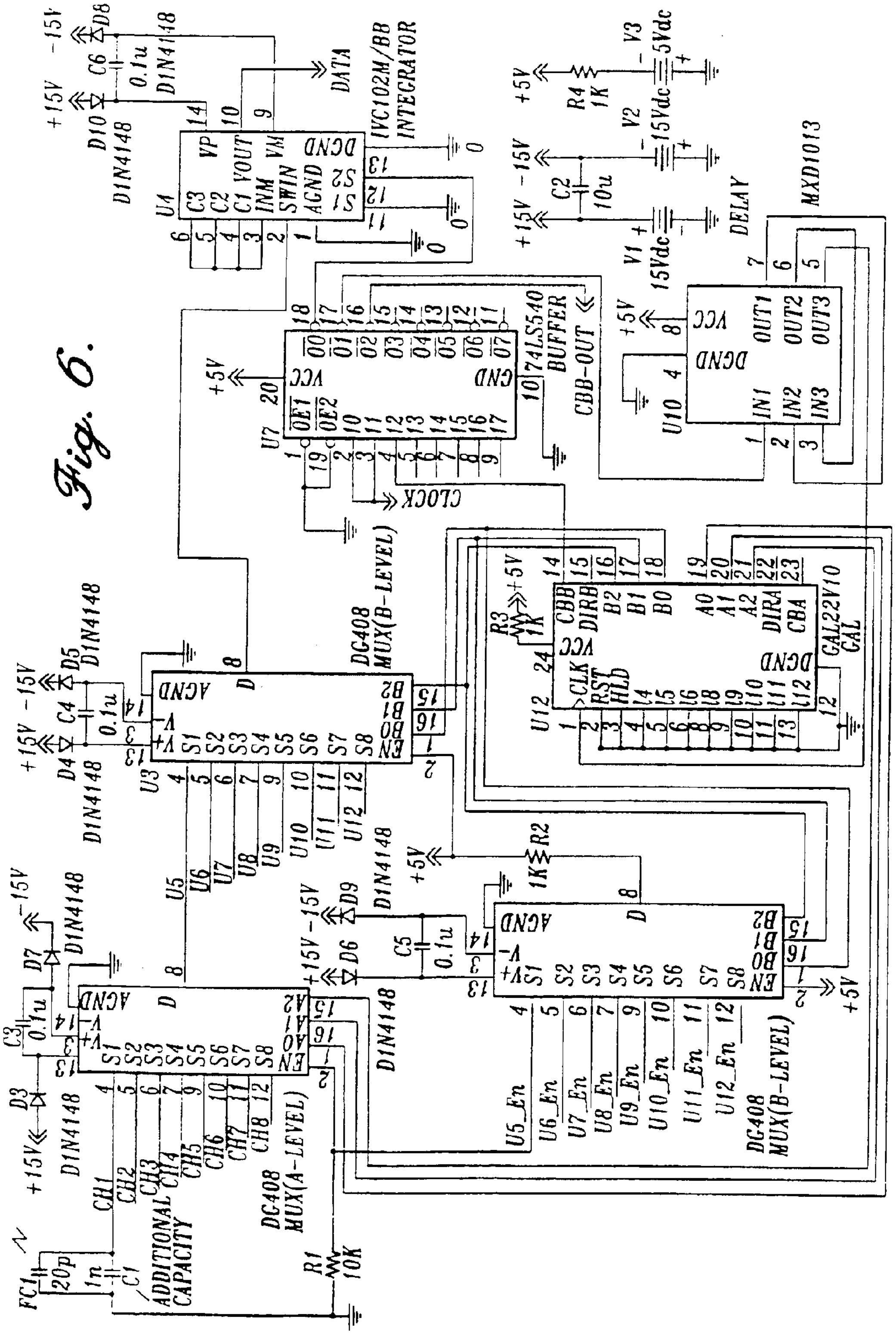
FIG. 6 is a circuit diagram of a representative electronic multiplexing unit interfaced to a representative FCDA formed in accordance with the present invention illustrating 64 input channels connected to a single output channel (for simplicity only one input channel is shown)

DRIE Microfabricated FCDA. Alternatively, a microfabricated FCDA can be formed by an etching approach, which can be achieved using either wet etching of (111)-oriented Si wafers or by deep reactive ion etching (DRIE) in more standard-(100) oriented Si wafers. Both methods produce nearly vertical sidewalls to the etched cups that are necessary for charged particle trapping with minimal backscatter. FIG. 5 illustrates the type of sidewall profile which is possible with DRIE and shows a prototype MFCA fabricated by Lucas NovaSensor of Fremont, Calif.

Fabrication of the etched micromachined Faraday cup array (INCA) includes four steps: (1) etching of vertical sidewall trenches into a silicon substrate; (2) conformal oxidation of the silicon surfaces; (3) conformal deposition of the cup conductor; and (4) patterning of the cup conductor material to form isolated electrodes. Each of these steps can be performed in several different ways. This embodiment is generally compatible with conventional trench capacitor formation that is used in silicon memory integrated circuit chips, and thus the FCDA and MUX can potentially be integrated into a single monolithic integrated circuit chip that contains both the detector array and the active transistors necessary to realize the analog multiplexing and charge integration.

Deep etching of silicon to achieve vertical sidewalls can be accomplished either by deep reactive ion etching (DRIE) or by anisotropic hydroxide etches into (110) plane silicon. D. A. Baglee, et al., "Properties of Trench Capacitors for High Density DRAM Applications," *IEDM Tech. Digest*, pp. 384–387, December 1985. One preferred DRIE process is the Bosch process, which utilizes a high-density plasma source and a gas mixture to etch essentially vertical sidewall holes using only photoresist as a masking layer. This process was originally developed to provide higher density trench isolation and trench capacitor structures for DRAMs, but is now finding many other applications in micromachining. This process works on any orientation of silicon wafer, but has a very high cost per wafer and requires very specialized equipment. An alternative of wet anisotropic etching is by comparison very inexpensive, introduces no mechanical stress, and requires very simple equipment: only a temperature-controlled bath. Anisotropic etching to produce vertical sidewalls requires oxide or nitride masking layers and only works with (110) oriented silicon wafers which provide (111) etch stop planes that are perpendicular to the wafer surface. Potassium hydroxide and tetramethyl ammonium hydroxide (TMAH) are the most favored etchants for this purpose. E. Bassous, "Fabrication of Novel Three-Dimensional Microstructures by the Anisotropic Etching of (100) and (110) Silicon," *IEEE Trans. Electron Dev.*, Vol. ED-25, No. 10, pp. 1178–1185, October 1978. K. E. Bean, "Anisotropic Etching of Silicon," IEEE Trans. Electron Dev., Vol.

ED-25, No. 10, pp. 1185–1193, October 1978. H. Seidel, L., et al., "Anisotropic Etching of Crystalline Silicon in Alkaline Solutions, Parts I and II," *J Electrochem. Soc.*, Vol. 137, No. 11, pp. 3612–3626, pp. 3626–3632, November 1990. However, (110) wafers, being nonstandard for the semiconductor industry, are quite expensive and difficult to obtain. Also, because the (111) etch stop planes are not perpendicular to one another, only two opposite faces of the etched pit will have vertical sidewalls; the other two sides are terminated in a pyramidal corner. Nevertheless, vertical sidewall slots can be obtained, and have been used effectively in producing microminiature Joule-Thompson refrigerators. D. B. Tuckerman, et al., "High Performance Heat Sinking for VLSI," *IEEE Electron Dev. Lett.*, Vol. EDL-2, No. 5, pp. 126–129, May 1981. W. A. Little, "Microminiature Refrigeration," *Rev. Sci. Instrum.*, Vol. 55, No. 5, pp. 661–680, May 1984. A similar slot-like pit can be used for the MFCA.

Creation of a conformal oxide layer can be performed by oxidation of the native silicon or by deposition of silicon dioxide ($SiO_2$) using a chemical vapor deposition (CVD) process based on either silane or tetraethoxysilane (TEOS) and oxygen. Native oxidation is generally preferred for creating electronically superior Si—$SiO_2$ interfaces (as in MOSFET production), but requires temperatures of 900° to 1100° C. CVD processes can be operated at temperatures of only 400° to 500° C., but produce poorer quality films, which can contain high levels of mechanical stress. Native oxidation is very easy and safe to perform, while CVD oxide deposition requires expensive furnace systems and toxic and pyrophoric gases.

Deposition of the cup conductor requires a conformal film of reasonably high conductivity that exhibits minimal mechanical stress with the other layers of the device. Excessive stress will cause the thin webs that separate adjacent cells to crack, destroying the device. This problem is more critical in (110) oriented silicon wafers, in which (110) cleavage planes run directly through the webs. Further, any mechanical stress will be exacerbated by thermal expansion coefficient differences between the cup conductor material and the underlying layers. From these considerations, polysilicon and tungsten are the suitable choices for the cup conductor. Both are commonly deposited by CVD processes, and both have thermal expansion coefficients that are nearly identical to single crystal silicon (2.6 ppm/° C.). More importantly, both are processes that are commonly used in the semiconductor IC industry and which are readily available at reasonable cost.

Patterning of the cup conductor material involves etching it away through photolithographically patterned holes in a masking layer. Both polysilicon and tungsten can be etched rapidly and controllably by plasma processes, which are again standard for the IC industry. However, masking a layer that is extremely nonplanar is in general very difficult and usually avoided. The usual approach is to first planarize the surface by applying a thick layer of some organic compound, either photoresist or polyimide, both of which can be applied by spin coating. Fortunately, the etched part of the cup conductor exists only on the surface of the wafer, so the planarization process is only needed to temporarily fill the cups during etching. The principal hazard in this process is that the organic layers are stripped by solvents at the end and this process can produce swelling of the resist or polyimide, which might produce cracking of the webs. Alternatively, an oxygen plasma could be used to ash the organics.

Operation of FCDA and MUX. The operation of FCDA and MUX of the invention is illustrative. In operation, a charged particle beam enters and impacts the Faraday cup detector array. Each of the cups collects the charged particle flux during the measurement time. Thereafter, each cup is read out sequentially by dumping its charge into an integrating operational amplifier. A sample-and-hold function on the operational amplifier integrator chip (Burr-Brown IVC102) measures the accumulated charge and passes the result as a DC-voltage over to an analog-to-digital converter on a PC data acquisition board. This board is housed in an IBM-PC (386-Gateway). The rate for this readout is only limited by how long one desires to accumulate charge. Because the entire array is detected simultaneously, slower scan times permit higher sensitivity without increased noise. The systems have been tested at acquisition rates for reading each cup of 17 Hz to 170 kHz.

To avoid having numerous output lines for the FCDA, the present invention provides a multiplexing unit (MUX) and amplifier interfaced with the FCDA to provide a single output line for the entire array. The MUX-unit sequentially connects each cup of the array to the one output line. As the MUX cycles through the cups based on an input clock signal, only a single cup is connected to the amplifier (output line) at any one time. All other cups face an open switch with a high input impedance ($10^{15}$ Ohm) while they are waiting to be reconnected to the output line. As discussed above, Faraday cups have the unique advantage to be able to collect the incident charged particle beam independent of its charge state and effectively integrate the incoming charged particle beam continuously. With a MUX-unit switched through the array sequentially, the integrated charge of each cup is drained, amplified, and measured cyclically.

The MUX switch, such as a 64:1 or a 256:1 switch, is a composed of a cascade of smaller switches. For example, 8 individual 8:1 units feeding into a second level of one 8:1 MUX form the 64:1, respectively, the 256:1 unit is composed of 16 (16:1) feeding one 16:1 MUX. The 8:1 MUX switches can be commercial MUX switches (DG408, DG436). The MUX switches are connected to a GAL-chip (GAL22V10 or GAL26V12), which provides the logic to the MUX to perform the switching. The logic ensures a signal path through two levels of switches. A Gray code provides sequential readout of the FCDA and a unique charged particle current path at any point in time. Also, the signal logic to drive the MUX switches is generated with a GAL chip, or a computer board with logic output lines can also be used. By adding more layers to the MUX cascade, even larger MUX switches (larger than the 256:1 unit) can be developed and used. The system of the invention is upwardly scalable.

Electron multiplier and microchannel plate (MCP) detectors have very high gain factors ($10^6$); whereas a Faraday cup by itself has a gain of only unity. For a nonscanning instrument, the time available for amplification of the accumulated charge is long ($10^{-6}$ sec) in typical applications, such as in the system discussed below. Therefore, a high gain operational amplifier integrator (>$10^6$-V/C) can be used. However, the superb dark counting rates of MCP units cannot be achieved with operational amplifier circuitry. Taking advantage of the op-amp gain in this manner is possible only because the FCDA is a nonscanning device utilizing the integrating character of the cups in combination with the MUX unit. Using a MCP together with the Faraday cup array can increase the sensitivity of the FCDA. Such a configuration can enable single charged particle counting capabilities.

Faraday cup detectors inherently have wide dynamic range capabilities. The individual cups can collect orders of magnitude different amounts of charge. The invention operates electronically to automatically accommodate for large differences in the voltage outputs from the individual cups. Therefore, it is unnecessary to switch between multiple detectors, as is sometimes done in conventional MS instruments in order to obtain a wide dynamic range.

FCDA Duty Cycle. Because all of the individual Faraday cups, with the exception of the single cup that is momentarily being read out, collect all ions continuously, the duty cycle is (N−1)/N, with N being the number of cups in the array. For arrays with more than 64 units, duty cycles of higher than 98% are achieved. For a representative 256 unit FCDA of the invention, a duty cycle of >99% is realized. The duty cycle does not depend on the scan frequency, which is used to read out the array.

Others (e.g., Berte, et al., U.S. Pat. No. 4,290,012; Okuda, et al., U.S. Pat. No. 4,992,742; or Benveniste, et al., U.S. Pat. No. 5,198,676) have described detector arrays that are designed for ion beam profiling applications, such as in ion implantation into semiconductors. These applications involve very high ion beam fluxes, for which detector sensitivity is not a critical design issue. The references describe detector arrays that achieve high spatial resolution by means of mechanical translation of either the array as a whole or a beam limiting aperture, and the electromechanical control of the array relative to this aperture is an essential component of the overall design. Our FCDA involves no moving parts and the individual cups remain open to capture the incident charged particle flux at all times. This feature gives our FCDA much improved sensitivity, which is required for chemical analysis methods, such as mass spectrometry. For example, the charged particle beam profiling described by Benveniste et al., (U.S. Pat. No. 5,198,676) uses a rotating graphite disk with a radial slot to cyclically scan around a series of annular detector conductors that have been patterned onto an insulating substrate. Thus, the majority of the incident charged particle beam is blocked by the rotating disk, allowing only a small fraction of the total charged particle beam flux to be captured upon the detector array itself. By keeping all of the individual Faraday cups open at all times, true multichannel detection is achieved, while the cups can be sequentially read out by the electronic multiplexing and charge integration.

Figure 7:
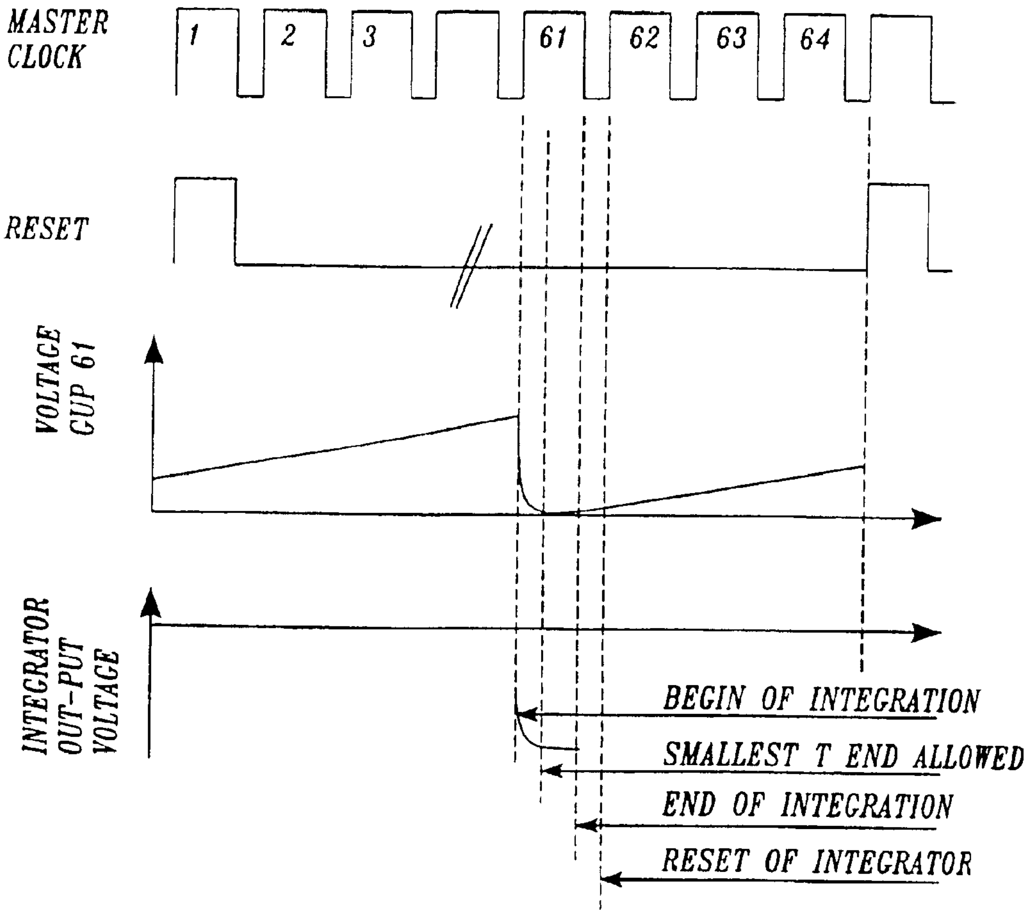
FIG. 7 is a timing diagram of the readout process for a representative Faraday cup detector array and integrator unit for Faraday cup number 61.

FIG. 7 shows the timing diagram of the readout process of the Faraday cup detector array. The absolute intensity of the charged particle beam being collected by the Faraday cup detector can be determined quite easily. The capacitance of the Faraday cup is charged by the collected charged particle beam current to a potential of $$V(T_{cycle})_{PC}^{MAX}=I_{Ion}\ T_{cycle}/C_{F-Cup} \qquad (1)$$

while the cup remains unconnected by the off-state of the analog switch multiplexer ($R_{off}>10^{15}\ \Omega$). Here $I_{Ion}$ is the charged particle beam current, $T_{cycle}$ is the period of the readout cycle, and $C_{F\ .\ Cup}$, is the capacitance of the individual Faraday cup. The readout cycle is generated by a "master clock" of period cask such that, $T_{cycle}=Nt_{clock}$, whereby N is the number of cups in the detector array.

Once a (charged) Faraday cup is connected via the analog switch of the multiplexer chip to the integrator, the virtual ground at the input of the integrator will cause the accumulated charge to flow from the selected Faraday cup of the array into the integrator and charge up the integrator capacitor. The time dependence of the discharge of the Faraday cup is governed by the resistance between the cup and the integrator (R=400 Ω) as well as the capacitance of the Faraday cup ($C_{F\ .\ Cup=}0.75$ nF, for linear FCDA, FIG. 3):

$$V(t)_{Fc}=V(T_{cycle})_{FC}^{MAX}\exp(-t/RC_{F-Cup} \qquad (2)$$

The integrating chip (Burr-Brown IVC-102) is an integrating transimpedance amplifier. Its output voltage $V(t)_{out}^{INT}$ is proportional to the integrating time, $T_{cycle}$, and inversely proportional to the feedback capacitor, $C_{INT}$. The effective transimpedance gain is—$T_{cycle}/C_{INT}$ $$V(t)_{out}^{INT} = \frac{-1}{C_{INT}}\int J(t)dt. \qquad (3)$$

Using $I(t)=(t)_{FC}/R$, the output voltage of the integrator for the charge accumulated by the Faraday cup becomes:

$$V(t_{end})^{INT} = \frac{-V(T_{cycle})_{FC}^{MAX}}{C_{INT}R}\int_0^{t_{end}}\exp\{-t/RC_{F-Cup}\}dt. \qquad (4)$$

The integration must be completed within a cycle of the master clock, $t_{end}=t_{clock}0.8$ This constraint defines the RC time constant of the integrator circuit. Thus $V(t_{end})^{INT}$ $$V(t_{end})^{INT} = \frac{V(T_{cycle})_{FC}^{MAX}C_{F-Cup}}{C_{INT}}(\exp\{-t_{end}/RC_{F-Cup}\}-1). \qquad (5)$$

In one typical embodiment of the FCDA, R=400 Ω and $C_{F-Cup}=0.75$ nF, giving an integration time constant of RC=0.3 μsec, compared to $t_{end}=8.0$ μsec for the fastest evaluated master clock speed of 100 kHz. This easily satisfies the constraint of limit $\rightarrow t_{end}\geqq 2\ RC_{F\ .\ Cup}$, making the integrator output nearly independent of the actual integration time, $t_{end}$. This feature simplifies the data acquisition substantially. The control computer's speed need only match the master clock speed and does not have to produce the very fast (submicrosecond) integration process itself. Therefore, a low-cost data acquisition card is all that is necessary to interface the system to a PC. The integrator output voltage is therefore $$V(T_{cycle})^{INT} = \frac{-V(T_{cycle})_{FC}^{MAX}C_{F-Cup}}{C_{INT}}, \qquad (6)$$

which is a direct measure of the charged particle current intercepted by the cup $$V(T_{cycle})^{INT} = \frac{I_{Ion}}{C_{INT}}T_{cycle}. \qquad (7)$$

Typically, the system is set up for a total gain of G $8\times10^{7}$V/C. In a typical mass spectroscopy (MS) scan, peak voltages of up to 3V (for argon), which corresponds to a charged particle beam flux of 38 nA, can be read with a signal-to-noise ratio better than 200:1. The full gain of the IVC-102 chip was reduced by a factor of 30 to prevent oversaturation of the system. Even then, such high gains, with low noise levels are very hard to achieve with conventional transimpedance amplifiers in a direct measurement of the collected charged particle current, because the integrator averages the noise, thus reducing its contribution significantly.

Figure 9:
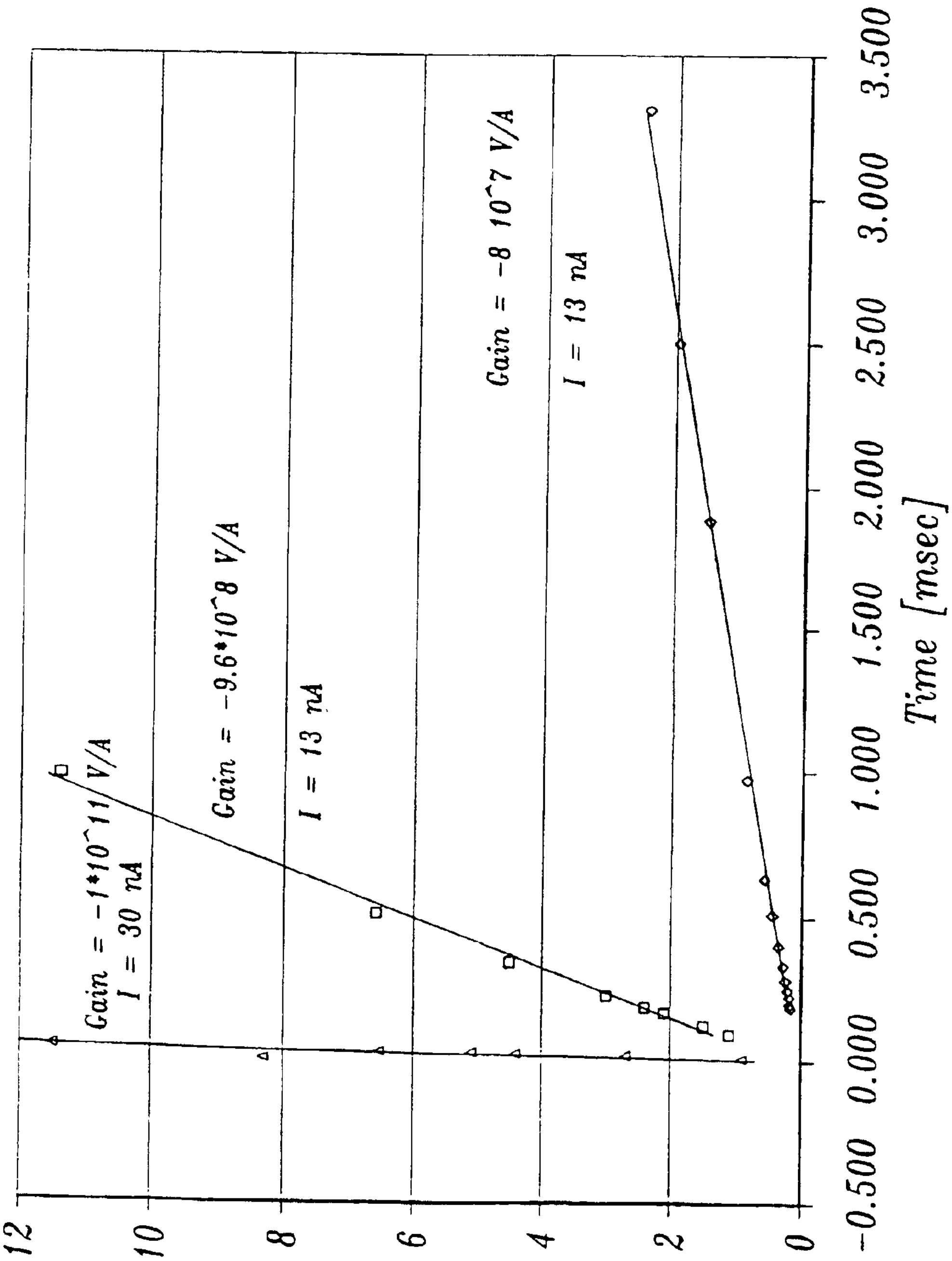
FIG. 9 is a graph illustrating the argon ion signal observed with the linear FCDA (see FIG. 3) as function of master clock time, the array has been readout with a master clock frequency ranging from 300 Hz to 102.4 kHz; the linear drop-off of the output signal originates in the reduced time, which is given to collect the ions with the detector, the slope of the curve is proportional to the ion current and the amplifier gain; the three curves shown represent measurements with different gain settings on the integrating op-amp and different ion currents (diamonds: Gain=−8* 10+7 V/C, I=13 nA; full squares: Gain =−9.6*10+8 V/C, I=13 nA; triangles: G=−1.0*10+11 V/C, I=30 nA)
Figure 10:
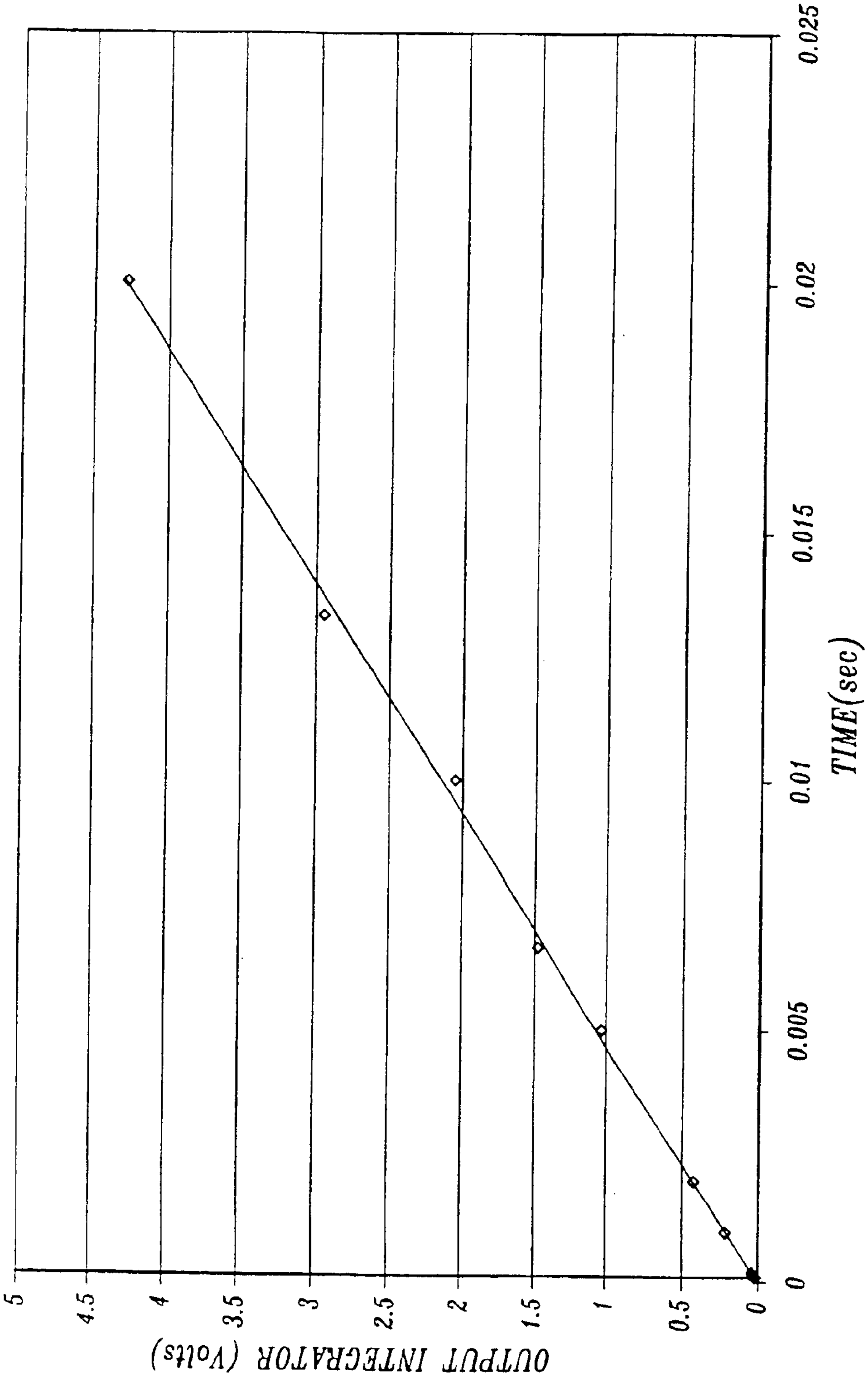
FIG. 10 is a graph illustrating the argon ion signal observed with the two-dimensional FCDA (see FIG. 2A) as function of master clock time, the array has been read out with a master clock frequency ranging from 37 Hz to 10 Hz to measure a highly collimated ion beam of 33 nA; the linear drop off of the output signal originates in the reduced time, which is given to collect the ions with the detector; the slope of the curve is proportional to the ion current and the amplifier gain.

FCDA Readout Speed. The FCDA of the invention can be read out very rapidly. In FIGS. 9 and 10 the signal dependency of the argon ion beam as function of the clock frequency is plotted. The results have been measured with the setup described below. Note that here 64 master clock "ticks" are needed to measure a full readout mass spectrum. Because the charge in the detector array is integrated between each readout event, the signal strength becomes directly proportional to the system clock period. A representative FCDA has been tested with clock speeds from 17 Hz to 107 kHz, demonstrating that the readout speed and sensitivity can be readily adjusted by simply changing the data acquisition clock frequency.

The ion current collected by the Faraday cup array detector can be directly read from the signal versus readout time dependency. As discussed above, the charge accumulated in a Faraday cup is dumped into the integrator chip and the result is handed over to a commercially available data acquisition card that performs analog-to-digital conversion of the signal. Since the time constant of the integrator circuit (RC) is short compared to the clock frequency, and $T_{cycle}$=N $t_{clock}$, the first derivative of the integrator output voltage with respect to the clock frequency is directly proportional to the ion current $$\frac{dV(t_{clock})^{INT}}{dt_{clock}} = \frac{-I_{Ion}N}{C_{INT}}. \quad (8)$$

As shown in FIGS. 9 and 10, the observed argon ion signal is a linear function of clock-cycle time as demanded by Equation 8. Because the number of Faraday cups, N, and the integrator capacity are known, the ion current (I=13 nA) can be read from the slope of the signal versus time dependence.

FCDA and MUX Sensitivity and Dynamic Range. The highest current sensitivity can be achieved in a representative FCDA-integrator unit of the invention by reducing the feedback capacitor in the integrator unit and reducing the master clock speed. Reducing the feedback capacitor increases the gain of the amplification (see Equation (4)), whereby reducing the master clock speed increases the integration time of the Faraday cup prior to draining the charge into the amplifier. Varying both the master clock speed and feedback capacitor provides for access to a very large dynamic range.

Figure 11:
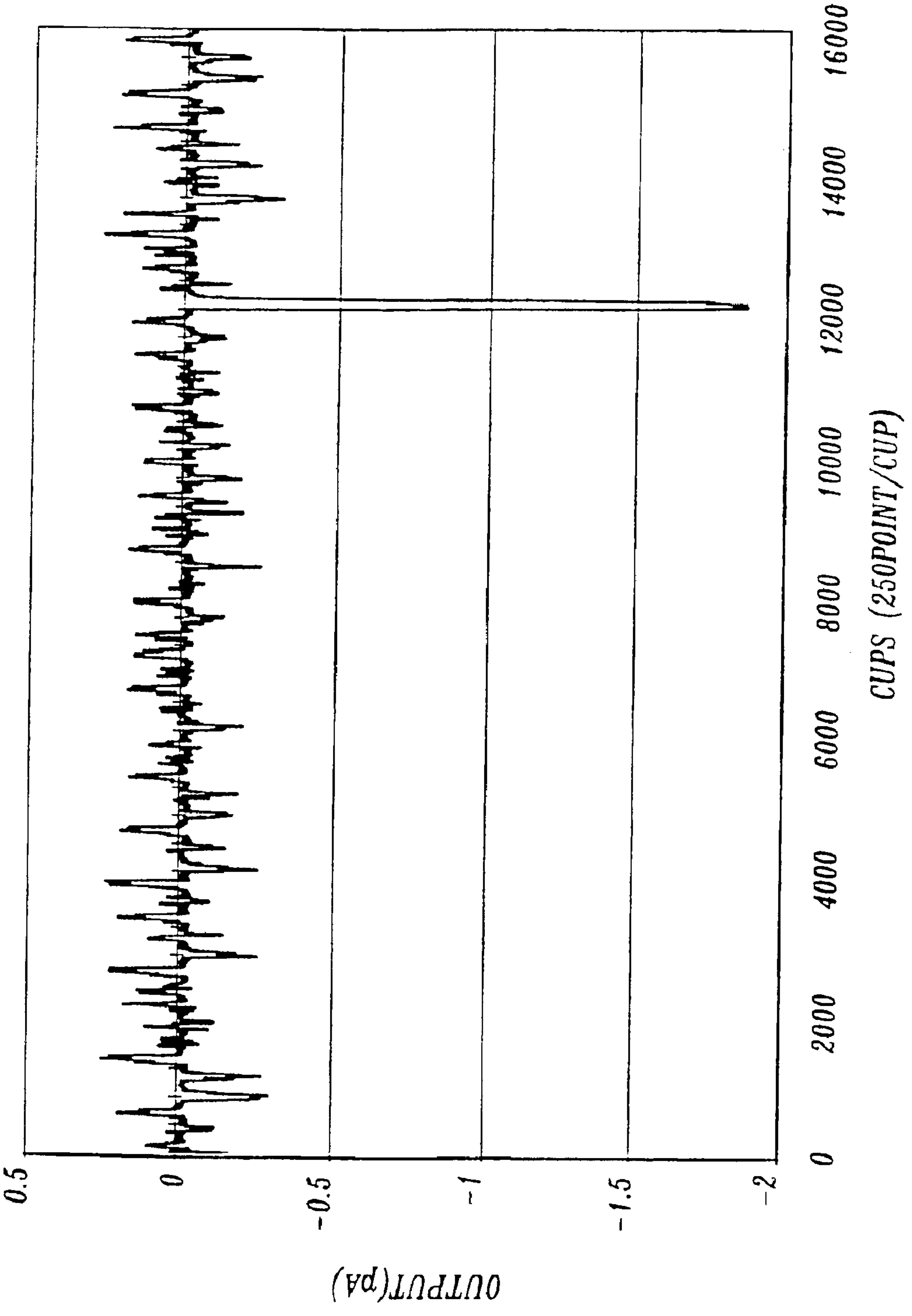
FIG. 11 is a graph illustrating a limit of detection measurement acquired with a two-dimensional FCDA (see FIG. 2A) at a master clock frequency of 37 Hz with a 2 pA Argon ion beam. The signal was acquired for 35 seconds and "boxcar averaged" (25 pts/window)

The lowest ion current that has been measured was I=1.7 pA. Collimating an argon ion beam with a variable aperture between the energy selector and magnet has formed this low ion current. The beam has been detected with a feedback capacitor of $C_{int}$=100 pF, and a readout frequency of 37 Hz. This detection limit can be decreased further through more sophisticated electronic layout such as combining MUX and op-amp on one circuit board and a subtraction of the charge-injected background noise. Comparing the I=1.7 pA (SNR 20:1, FIG. 11) current with the ion currents of 1.2 $\mu$A (FIG. 9), a dynamic range greater than 106 can be covered. As seen in FIG. 1I, this lowest measured signal is still significantly above the noise floor of 0.2 $\mu$A, indicating that even lower signals can be easily measured. These subpicoamp signals were not achieved due to the choice of ionization source used in the prototype and the associated difficulty in achieving a weaker stable charged particle beam. The dynamic range can be increased significantly because the frequency range of the master clock has been shown to vary from 100 kHz to 15 Hz and the feedback capacitor has been shown to vary from 10 pF to 1.1 nF.

Figure 8A:
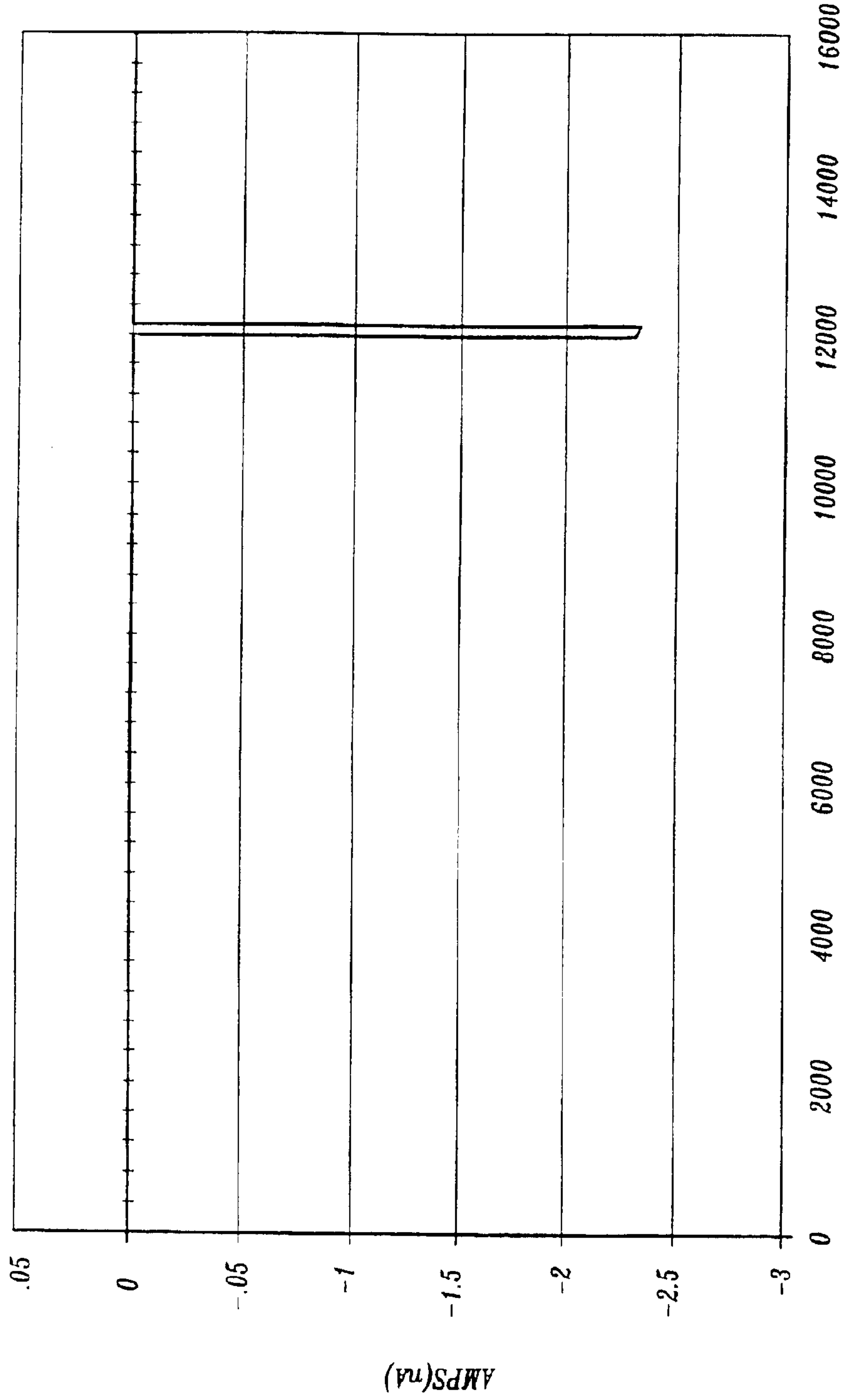
FIGS. 8A and 8B are graphs illustrating the effective crosstalk levels measured with the FCDA shown in FIG. 2A. A mask was placed on the detector array to shield all cups but one in order to measure the crosstalk level.
Figure 8B:
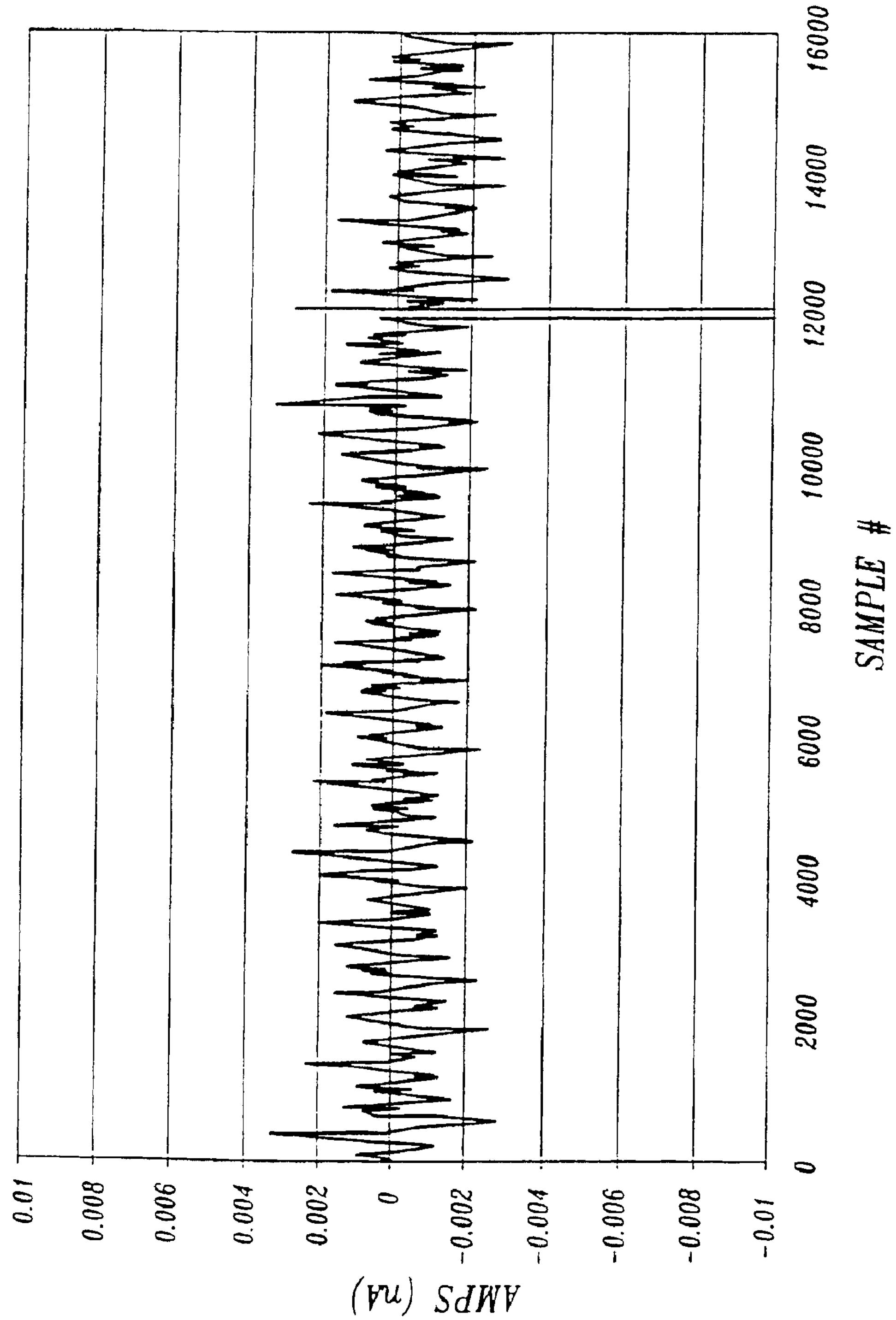

FCDA Crosstalk. As used herein, the term "crosstalk" refers to the signal contribution from the (high current receiving) Faraday cup to a signal on a neighboring cup. The crosstalk has been measured by placing a mask on top of the FCDA, thus allowing only one cup to receive an ion current (Ar+, I=2.3 nA). Because the FCDA has a low (below 2 pF) cup-to-cup capacity, relatively wide signal trace spacing of 0.008 inch, to the first level MUX switches, and ground shielding between the signal traces in the second level muxes, only a small crosstalk level of less than 750:1 is observed. The crosstalk level for a representative FCDA can been seen in FIG. 8.

FCDA/Computer Interface. For a representative embodiment, a "master" clock produces a free running TTL pulse train at a frequency of e.g., 675 Hz (tested from 37 Hz to 106 kHz), which defines the time base of the electronic multiplexing unit (MUX). The MUX uses this pulse train to connect the individual Faraday cups to the integrator chip (Burr-Brown IVC-102P) in a cyclic fashion and then returns to cups 0. The "low" part of the TTL pulse is used to reset the integrator circuit between each successive reading. In the beginning of the cycle (channel 0), the MUX unit sends out a TTL pulse, which is used to synchronize the PC-DACA board and the MUX-clock. Once this start pulse is received, the DACA board (National Instruments Lab PC+) makes a synchronous series of 12-bit analog-to-digital conversions at a rate of e.g., 5 kHz (higher conversion rates increase the number of data points per cup readout, which might be desirable in some applications). Background subtracted signals are read through turning the beam on and off via control of the static ion optics through the DACA board.

FCDA as Detector in a Confocal Plane Mass Spectrometer. The FCDA can be used as a charged particle beam monitor in a confocal plane mass spectrometer.

Figure 12:
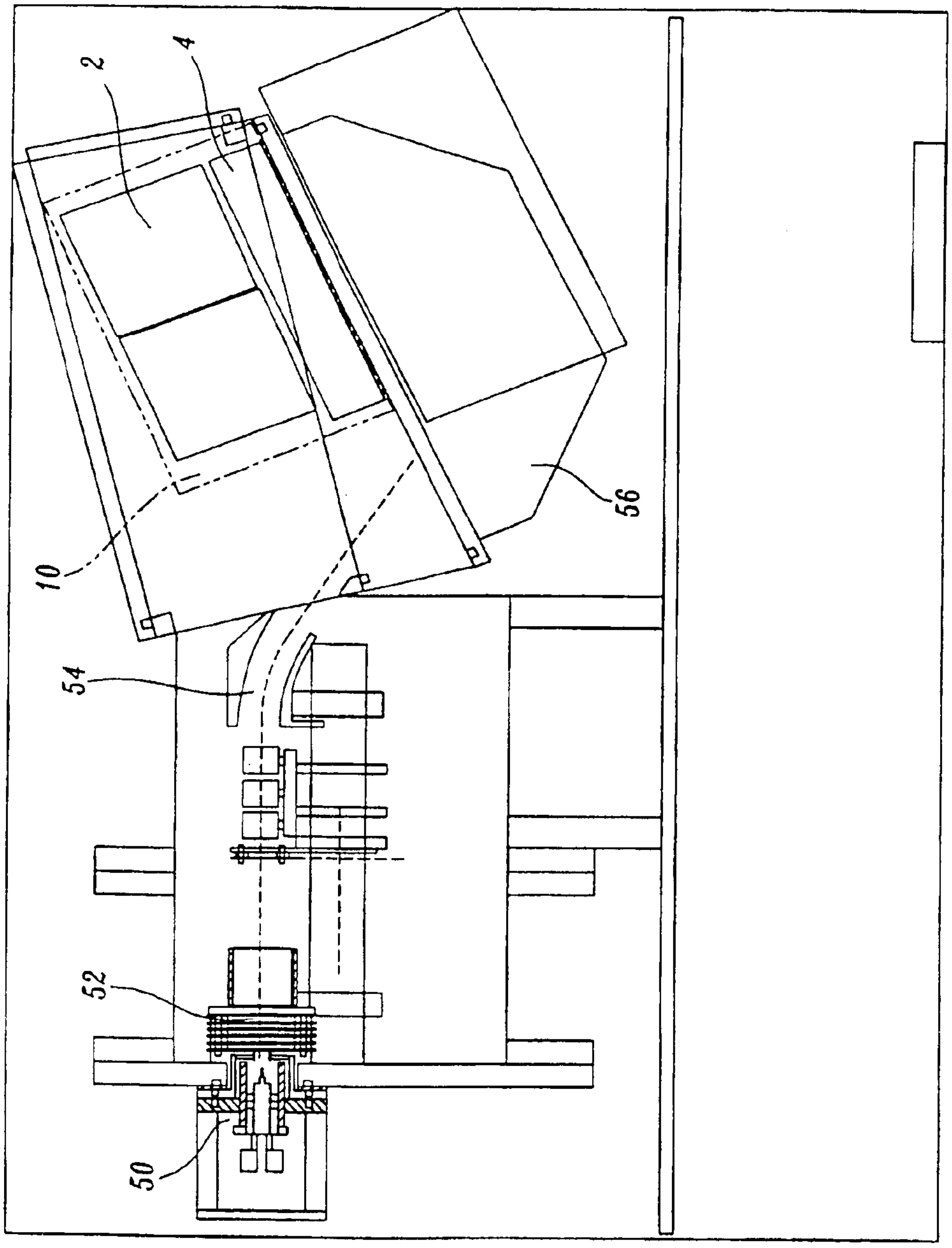
FIG. 12 is a diagram of a mass spectrometer that includes a representative linear FCDA (256 units), the ions are formed in the glow discharge, extracted from the source, energy selected, mass separated with a magnetic field, and recorded with a FCDA.

The basic concept of such a confocal plane mass spectrometer is shown in FIG. 12. The analyte is ionized in the ionizer (50), extracted out of the ionizer region and accelerated (52), energy selected in a static electrical sector field (54) and injected into a magnetic field (56). Here the ions are separated according to their molecular weight and detected with a position-sensitive integrating charged particle detector (10). The FCDA is placed in the focal plane of the charged particle beams and measures the position and intensity of the charged particle hitting the detector. Therefore, the FCDA reads out the mass spectrum of the charged particle beam without having to scan through the mass range. The concept enables the accumulation of a mass spectrum rapidly with a nearly 100% duty cycle. Furthermore, the detector can measure absolute ion currents. A linear dispersion mass spectrometer utilizing a representative FCDA formed in accordance with the present invention is described in A. A. Scheidernann, et al. "Linear Dispersion Mass Spectrometer", *Proceedings of the 47th American Society for Mass Spectrometry Conference on Mass Spectrometry and Allied Topics*, 1999, June 1999, Dallas, Tex.; and WO 99/17865, entitled "Magnetic Separator for Linear Dispersion and Method for Producing the Same," both expressly incorporated herein by reference in their entirety.

Figure 13:
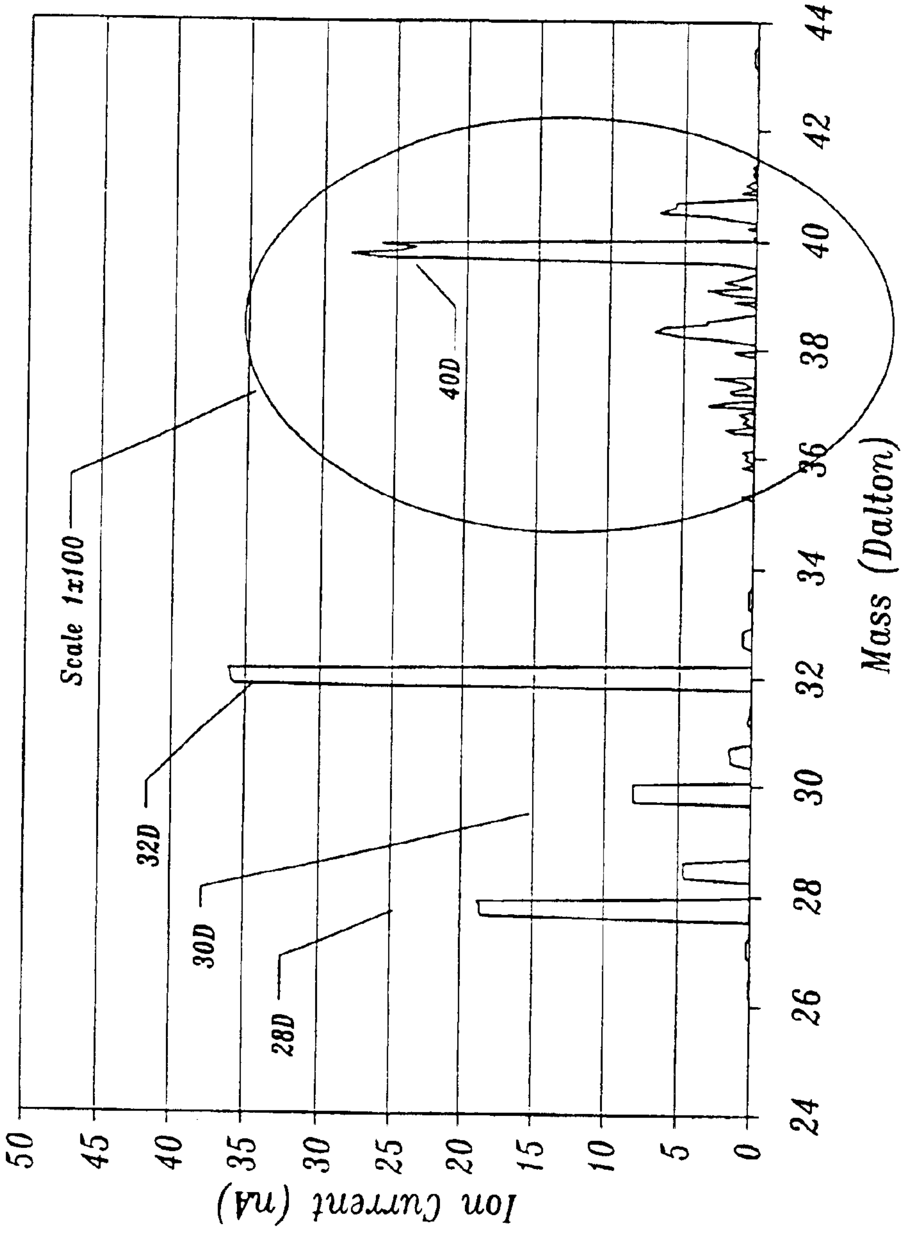
FIG. 13 is a mass spectrum of an air spectrum formed in a glow discharge (the x-axis is given in Dalton) of a mass spectrometer (see FIG. 12) that includes a representative linear FCDA.

FIG. 13 shows the output signal from the FCDA-MUX system for air mass separated in the LDMS detected with a 256 channel FCDA-MUX-Integrator (FIG. 3) as a function of the molecular weight. The ion current measured in the individual Faraday cups is plotted as function of the molecular weight, which is directly proportional to the cup number in the linear FCDA. Note that the ratio of the positions for the $O_2$, NO, $N_2$ and $Ar^{40}$ signals all lie on a straight line showing a linear distribution of the molecular weight on the detector plane. This linear dispersion pattern is due to the use of the linear dispersion magnet. This magnet is well matched to the linear FCDA. The mass spectrum can resolve the basic constituents expected in the gas mixture (NO originates from the glow discharge of $O_2$ and $N_2$). This FIGURE shows a signal/noise ratio greater than 500:1 as well as demonstrating the ability to baseline resolve between 2 Dalton mass differences. The signal-to-noise ratio for a less dominant peak, such as the natural argon peak (0.94% of air) is greater than 5:1.

The observed relative signal levels for different species are a function of the concentration of the analyte in the argon gas, as well as their relative ionization potentials. The oxygen abundance is increased due to the use of Teflon tubing in the gas inlet system, which is semipermeable to oxygen, thus increasing the oxygen partial pressure.

To summarize, the present invention provides a charged particle detection system that includes an electronic multiplexing unit and a plurality of charge-collecting zones. The multiplexing unit is in proximity to the charge-collecting zones and is further interfaced to a means for measuring the charge collected by the charge-collecting zones. Each charge-collecting zone includes a conductive material for receiving and storing charge. Suitable conductive materials include metals such as copper, chromium, gold, tungsten, and mixtures of these metals. In one preferred embodiment, the conductive material is a vapor-deposited mixture of chromium and gold. Each charge-collecting zone is isolated and electrostatically shielded from neighboring charge-collecting zones by a separator that is an insulated electrical conductor held at a reference potential (e.g., ground potential). Each of the charge-collecting zones is also electronically interfaced to the multiplexing unit. In the system, the charge-collecting zones can be supported by the separator. In one embodiment, the separator is composed of thin insulating and conducting layers. The insulating layer is made from a high dielectric strength, low leakage material. Depending upon the nature of the support, the insulating layer can include, for example, aluminum oxide, when the support is made from aluminum, or silicon dioxide when the support is made from silicon.

The electronic multiplexing unit effects switching and electrically connects each charge-collecting zone to a means for measuring the charge collected by those zones. The multiplexing unit effects switching through sequencing using a Gray-code. The system of the invention has a duty cycle for charge collecting in the charge-collecting zone greater than 98% for each readout cycle. Means for measuring the charge collected by the charge-collecting zones include charge measuring devices known in the art including, for example, operational amplifiers and operational amplifier integrators.

Generally, the plurality of charge-collecting zones includes $2^n$ zones, where n is an integer greater than zero. In one preferred embodiment, the system includes 64 zones and, in another preferred embodiment, the system includes 256 zones. In the system, at least one charge-collecting zone is a Faraday cup. Preferably, the plurality of charge-collecting zones is a Faraday cup detector array that is either linear or two dimensional. Generally, each Faraday cup has an aspect ratio greater than about 2:1 and, preferably, greater than about 3:1. As used herein, the term "aspect ratio" refers to the depth of the cup compared to the cup's width. The width is determined at the narrowest part of the cup; for circular cups, the width is the diameter.

A representative detection system of the invention is illustrated in FIG. 1. Referring to FIG. 1, system 10 includes electronic multiplexing unit 2 electronically interfaced to a plurality of charge-collecting zones 4 through electrical connecting means 8. Multiplexing unit 2 is also electronically interfaced to operational amplifier 6, a representative means for measuring the charge collected by the charge-collecting zones.

Figure 2A:
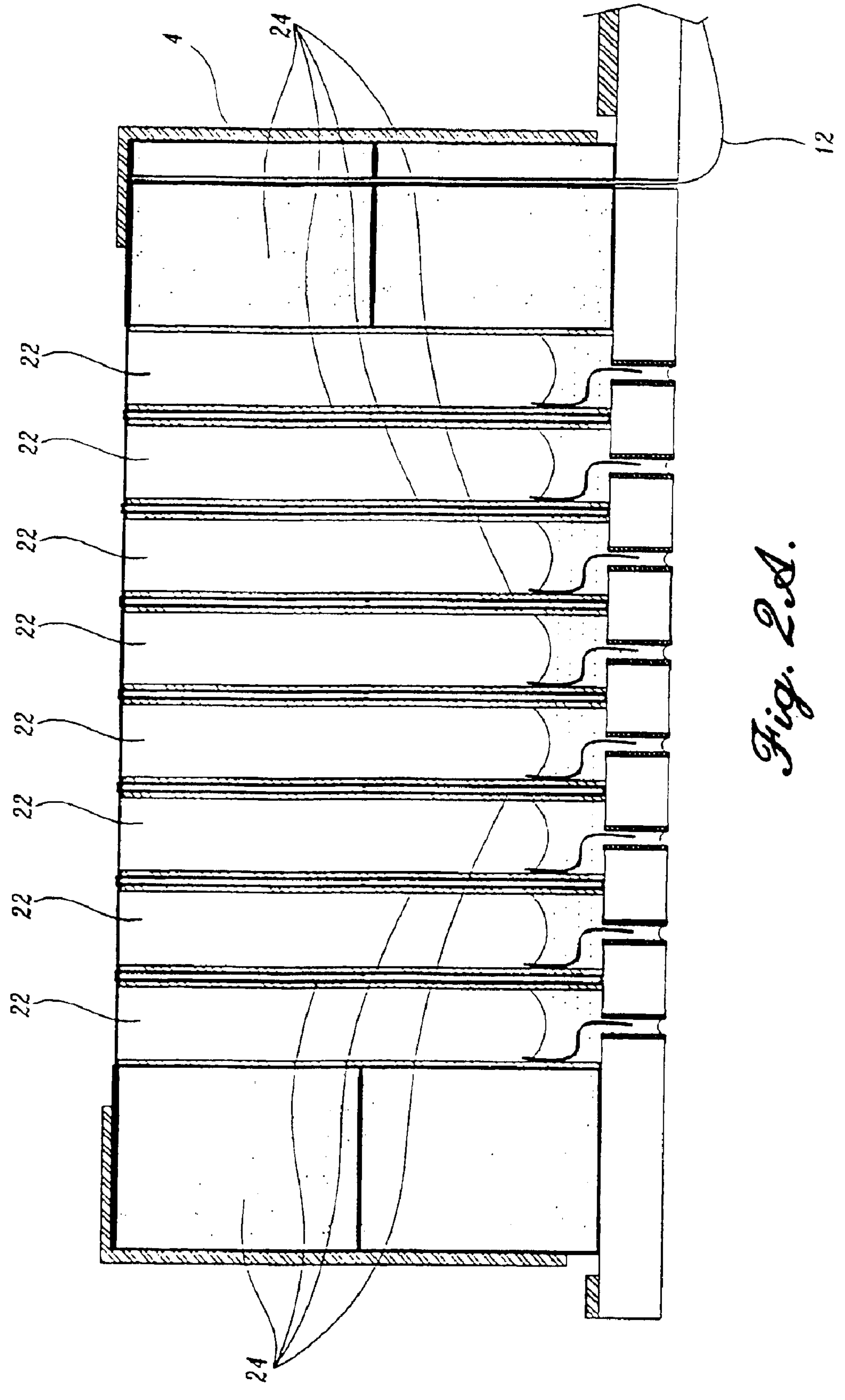
FIGS. 2A–2C are illustrations and views of a representative 64 element two-dimensional FCDA build in an anodized aluminum matrix.
Figure 2B:
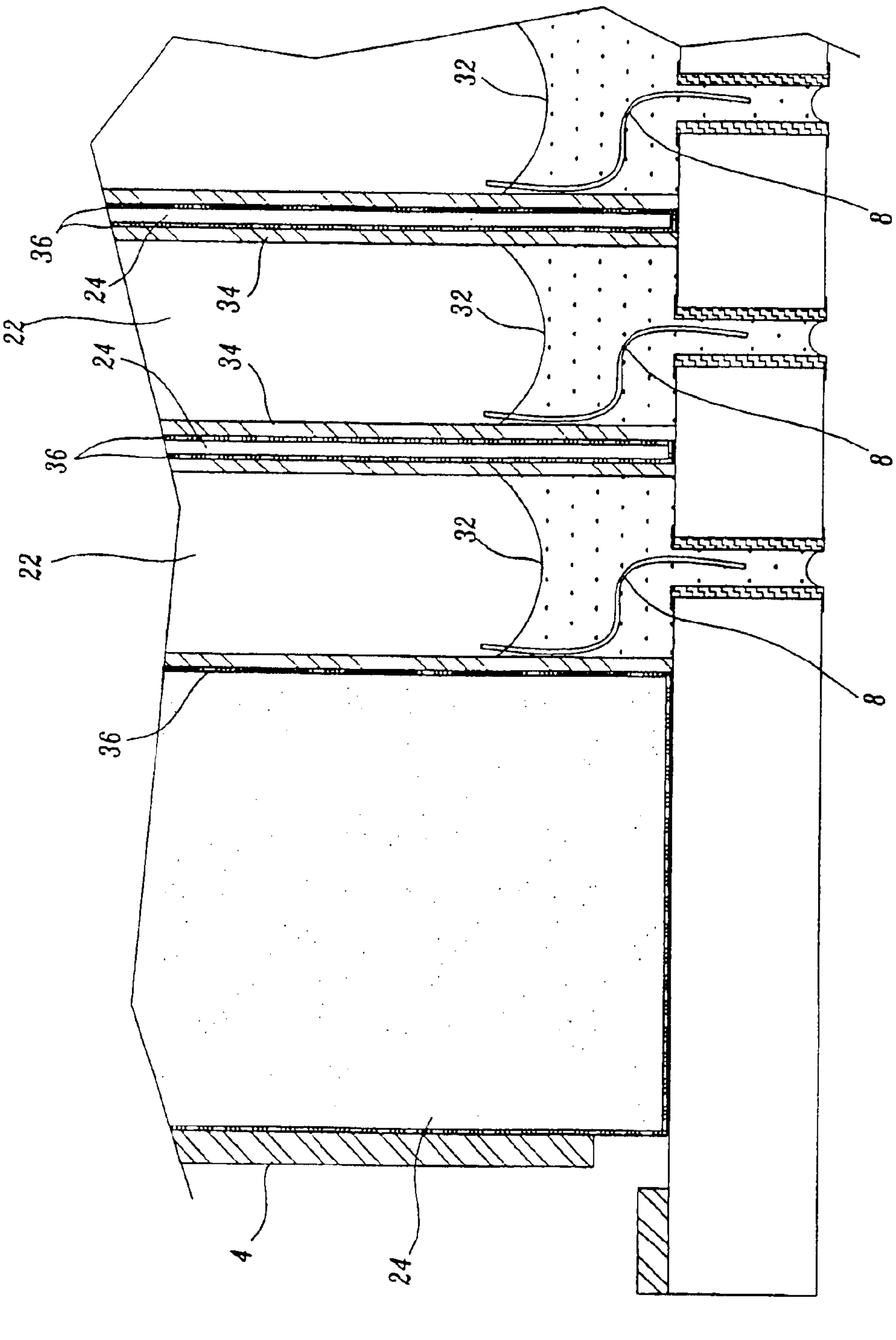
Figure 2C:
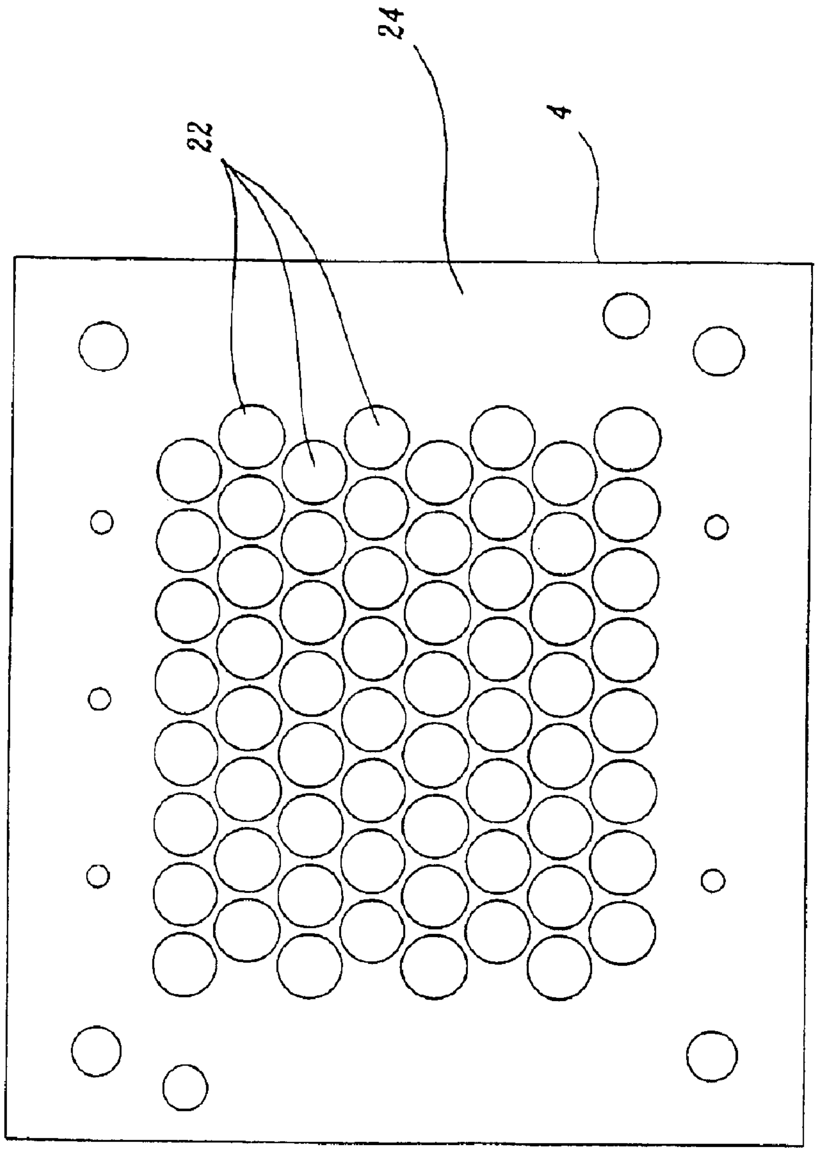

FIG. 2 illustrates a representative plurality of charge-collecting zones 4. Referring to FIG. 2, charge-collecting zones 22 are illustrated as supported by separator 24. Separator 24 is an insulated electrical conductor that is held at a reference potential as shown by electrical ground 12. FIG. 2B is a close-up view of FIG. 2A. Referring to FIG. 2B, charge-collecting zones 22 are defined by opposing walls 34 and floor 32 formed from conductive materials. These conductive materials are insulated from support 24 by insulating layers 36. The charge-collecting zone is electronically connected to the multiplexing unit through connecting means 8 (e.g., wires). FIG. 2C shows a top view of a representative portion of the system illustrating the plurality of charge-collecting zones. Referring to FIG. 2C, charge-collecting zones 22 are surrounded by separator 24.

In one embodiment, the plurality of charge-collecting zones includes a stack of Faraday cups. In such a Faraday cup detector array, the plurality of cups is supported by a partially insulated conductive housing. The conductive housing is electrically connected to a reference potential (e.g., ground potential). The array also includes a means for electrically connecting the plurality of cups to an electronic interface such as shown in FIG. 1. Each Faraday cup has a unit cell that includes two conductive material-clad insulating walls separated by a U-shaped conductive material. Each insulating wall has a first conductive surface that is in electrical contact with the U-shaped conductive material and a second conductive surface that is electrically connected to the reference potential. The U-shaped conductive material and the two first conductive surfaces define a conductive cup. The unit cell further includes a means for electrically connecting the conductive cup to the electronic interface. Referring to FIG. 3, charge-collecting zone 22 is defined by U-shaped conductive material 42 and adjacent conductive material-clad insulating walls having a first conductive layer 44, insulating layer 46, and second conductive layer 48. Layer 48 is electrically connected to the reference potential (e.g., ground). Each unit cell includes a means for electrically connecting the conductive cup to the electronic interface and, as illustrated in FIG. 3, this means is foil 8. In a preferred embodiment, the conductive housing is aluminum, the conductive material includes copper, and the conductive material-clad insulating wall comprises a copper/fiberglass/copper laminate sheet. The means for connecting the cup to the interface can be any known connecting means including, for example, metal wire and metal foil. In one preferred embodiment, the detector array includes either 64 or 256 Faraday cups.

In one embodiment, the separator, the plurality of charge-collecting zones, the electronic multiplexing unit, and the means for measuring the charge collected by the charge-collecting zones are mounted on a single substrate. Preferred substrates include printed circuit boards having traces, where the traces are electrically connected to the charge-collecting zones directly.

Systems formed in accordance with the present invention can include a plurality of charge-collecting zones that are microfabricated. Representative methods for microfabricating the charge-collecting zones include deep reactive ion etching and lithographie-galvanoformung-abformung processes.

A representative plurality of charge-collecting zones formed through deep reactive ion etching is illustrated in FIG. 5. Referring to FIG. 5, support 4 includes charge-collecting zones 22. Thus, in another embodiment, the present invention provides a Faraday cup detector array that includes a plurality of Faraday cups in a partially insulated conductive housing. As noted above, the conductive housing is electrically connected to a reference potential and the cup includes a conductive material isolated from the housing through an insulator. In a preferred embodiment, the conductive housing includes a silicon wafer having a length, width, and thickness and includes a plurality of wells formed into its thickness for receiving the cups. The array also includes means for electrically connecting the cup to an electronic interface with the means being in electrical connection with the cup. Preferred conductive materials include polysilicon and tungsten. In such an embodiment, the insulator is silicon dioxide and the means for electrically connecting the cup to the interface is a wire. The wells can be formed by either a deep reactive ion etching process or an isotropic hydroxide etching process, among others. Preferably, the array has a pitch from about 100 $\mu$m to about 500 $\mu$m. As used herein, the term "pitch" refers to the spatial resolution of the array (i.e., the distance between cups).

Figure 4A:
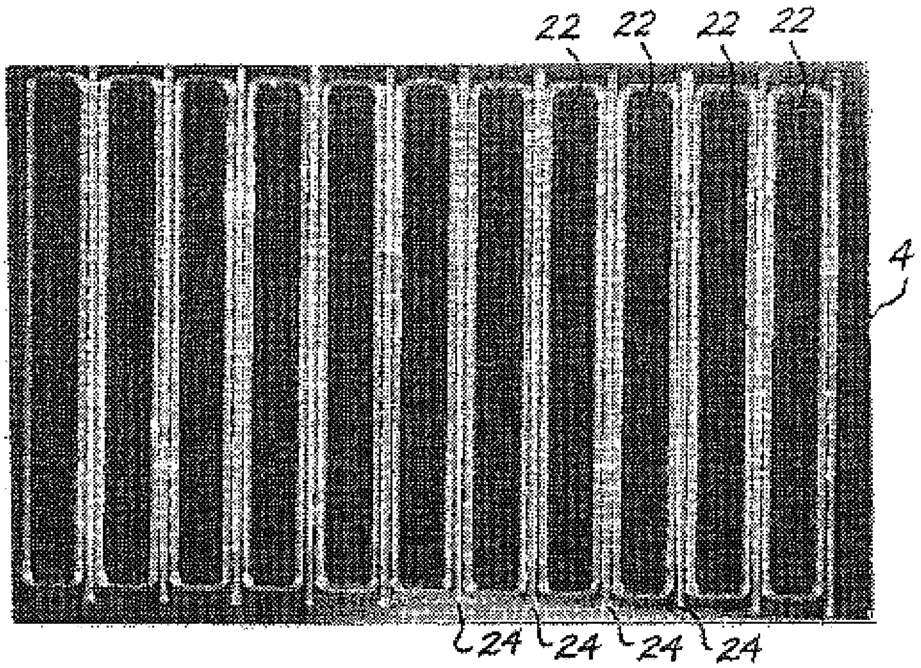
FIGS. 4A and 4B are images of a representative microfabricated FCDA using LIGA technology.
Figure 4B:
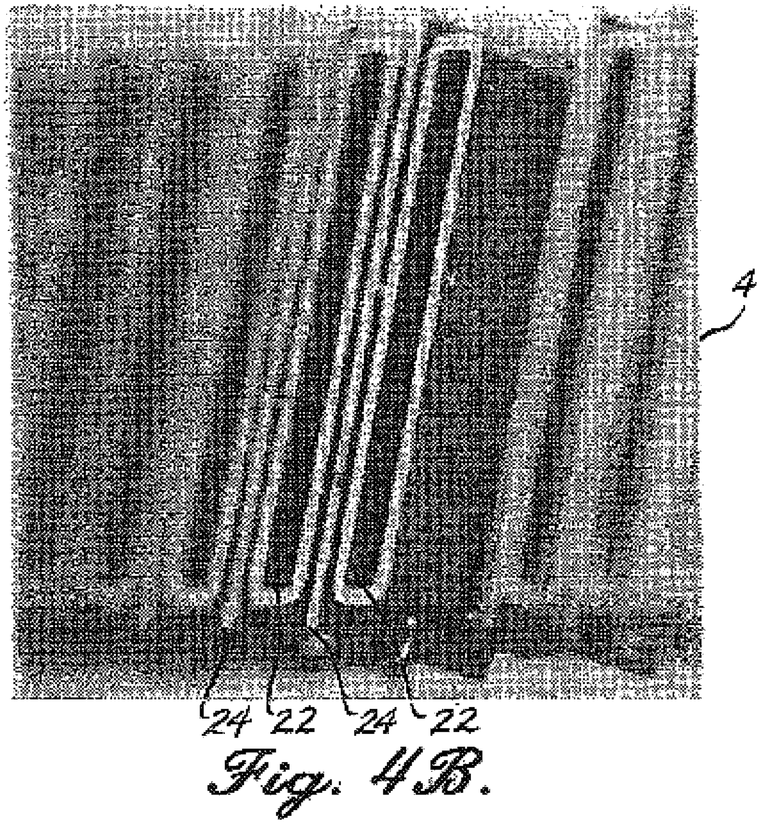

A Faraday cup array formed by the LIGA process is illustrated in FIGS. 4A and 4B. Referring to FIG. 4A, the plurality of charge-collecting zones 4 includes charge-collecting zones 22, which are isolated and electrostatically shielded from neighboring charge-collecting zones by separators 48, an electrical conductor held at reference potential (e.g., ground potential). In this embodiment, the separator is isolated from the charge-collecting zone by air or vacuum.

In another embodiment, the invention provides a Faraday cup detector array that includes a plurality of Faraday cups and a partially insulated conductive housing in which the cups are supported. The conductive housing is electrically connected to a reference potential and the cup includes a conductive material that is isolated from the housing through an insulator. In a preferred embodiment, the conductive housing includes an oxidizable metal block having a length, width, and thickness, and a plurality of channels machined through its thickness for receiving the cups. When the block is bonded to an insulating substrate having means for electrically connecting the cup to an electronic interface, the means are in electrical connection with the cup. Oxidizable metals useful in this embodiment include aluminum, copper, nickel, and titanium. In a preferred embodiment, the insulating substrate includes a printed circuit board and the means for electrically connecting the cup to the electronic interface is a trace on the circuit board.

In a preferred embodiment, the system includes charge-collecting zones that are surrounded by a separator made from aluminum. In this embodiment, the aluminum separator is hard anodized aluminum.

The system of the invention can further include a mask for reducing the loss of charged particles originating from sputtering after collection of highly energetic charged particles in the charge-collecting zones. The mask includes a first surface facing the charge-collecting zones and a second surface facing outward from the charge-collecting zones. The first surface is nonconductively attached to the charge-collecting zones and the second surface includes an electrically conductive surface. The electrically conductive surface provides a suppression grid held at a predetermined potential.

The system of claim 1 can also further include a heating means for increasing the temperature of the charge-collecting zones. In addition, the system can also include a temperature controlling means for controlling the temperature of the overall system. Ideally, the electronic portions of the system are cooled to increase signal-to-noise ratio and the charge-collecting zones are heated to reduce the sticking coefficient (i.e., to keep the cups clean).

In preferred embodiments, the charged particle detection system of the invention includes an FCDA that is microfabricated.

In one preferred embodiment, the FCDA is constructed from a compressed sandwich of precision-cut laminates and shims that define the Faraday cups and electrostatic separators.

In another preferred embodiment, the FCDA is constructed from a block of oxidizable metal (preferably aluminum) bonded to an insulating substrate with a metal oxide (aluminum oxide) forming an insulation layer. High aspect ratio channels are machined into the block to provide the Faraday cups.

In a further preferred embodiment, the FCDA is constructed using electric discharge machining (EDM) of a hard anodized metal such as aluminum, copper, nickel, or titanium.

In still a further preferred embodiment, the FCDA is constructed as an additive deposition or template electroplating of high aspect ratio metal regions to form the Faraday cups and their electrostatic separators. In this embodiment, the high aspect ratio metal parts can be created by LIGA processes. Alternatively, the high aspect ratio metal parts can be created by deep ultraviolet photolithography of thick photoresist.

In another preferred embodiment, the FCDA is constructed by subtractive etching of a single crystal semiconductor wafer or chip to form the Faraday cups having high aspect ratio. In such an embodiment, the conducting layer is silicon and the insulating layer is silicon dioxide. Alternatively, the conducting layer can be gallium arsenide. The etching can be done by deep reactive ion etching to form the cups. Thus, the FCDA can be formed on the same wafer or chip as other active electronic circuitry.

The detection system of the invention can be incorporated into a charged particle analyzer or charged particle separator including, for example, a mass spectrometer. A representative analyzer is illustrated in FIG. 12. Referring to FIG. 12, the analyzer includes an ion source 50, where the ions are extracted out of the analyzer region and accelerated (52), and then energy selected in a static electrical sector field (54) and injected into a magnetic field (56). The ions are then separated according to their molecular weight and detected with the system of the present invention (10) including multiplexing units 2 and a plurality of charge-collecting zones 4.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A Faraday cup detector array, comprising:

(a) a plurality of Faraday cups;

(b) a partially insulated conductive housing in which the plurality of cups is supported, the conductive housing being electrically connected to a reference potential; and (c) means for electrically connecting the plurality of cups to an electronic interface, wherein each Faraday cup has a unit cell comprising two conductive material-clad insulating walls separated by a U-shaped conductive material, each insulating wall having a first conductive surface in electrical contact with the U-shaped conductive material and a second conductive surface electrically connected to the reference potential, the U-shaped conductive material and two first conductive surfaces defining a conductive cup, and wherein each unit cell includes a means for electrically connecting the conductive cup to the electronic interface.

2. The array of claim 1, wherein the conductive housing comprises aluminum.

3. The array of claim 1, wherein the reference potential is ground potential.

4. The array of claim 1, wherein the conductive material comprises copper.

5. The array of claim 1, wherein the conductive material-clad insulating wall comprises a copper/fiberglass/copper laminate sheet.

6. The array of claim 1, wherein the means for electrically connecting the conductive cup to the electronic interface is selected from the group consisting of a metal wire and a metal foil.

7. The array of claim 1 comprising 64 Faraday cups.

8. The array of claim 1 comprising 256 Faraday cups.

9. A Faraday cup detector array, comprising:

(a) a plurality of Faraday cups;

(b) a partially insulated conductive housing in which the plurality of cups is supported, the conductive housing being electrically connected to a reference potential, wherein the cup comprises a conductive material isolated from the housing through an insulator, wherein the conductive housing comprises an oxidizable metal block having a length, width, and thickness, and a plurality of channels machined through its thickness for receiving the cups, wherein the block is bonded to an insulating substrate having means for electrically connecting the cup to an electronic interface, the means for electrically connecting the cup to the interface being in electrical connection with the cup.

10. The array of claim 9, wherein the oxidizable metal is selected from the group consisting of aluminum, copper, nickel, and titanium.

11. The array of claim 9, wherein the conductive material comprises copper.

12. The array of claim 9, wherein the reference potential is ground potential.

13. The array of claim 9, wherein the insulator comprises aluminum oxide.

14. The array of claim 9, wherein the insulating substrate comprises a printed circuit board.

15. The array of claim 9, wherein the means for electrically connecting the cup to the electronic interface is a trace on a printed circuit board.

16. The array of claim 9, comprising 64 Faraday cups.

17. The array of claim 9, comprising 256 Faraday cups.

18. The array of claim 9, wherein the array is a two-dimensional array.

19. A Faraday cup detector array, comprising:

(a) a plurality of Faraday cups;

(b) a partially insulated conductive housing in which the plurality of cups is supported, the conductive housing being electrically connected to a reference potential, wherein the cup comprises a conductive material isolated from the housing through an insulator, wherein the conductive housing comprises a silicon wafer having a length, width, and thickness, and a plurality of wells formed into its thickness for receiving the cups; and (c) means for electrically connecting the cup to an electronic interface, the means for electrically connecting the cup to the interface being in electrical connection with the cup.

20. The array of claim 19, wherein the conductive material is selected from the group consisting of polysilicon and tungsten.

21. The array of claim 19, wherein the reference potential is ground potential.

22. The array of claim 19, wherein the insulator comprises silicon dioxide.

23. The array of claim 19, wherein the means for electrically connecting the cup to the electronic interface is a wire.

24. The array of claim 19, comprising 64 Faraday cups.

25. The array of claim 19, comprising 256 Faraday cups.

26. The array of claim 19, wherein the array is a linear array.

27. The array of claim 19, wherein the array is a two-dimensional array.

28. The array of claim 19, wherein the wells are formed by a deep reactive ion etching process.

29. The array of claim 19, wherein the wells are formed by an anisotropic hydroxide etching process.

30. The array of claim 19, having a pitch from about 100 $\mu$m to about 500 $\mu$m.

* * * * *

UNITED STATES PATENT AND TRADEMARK OFFICE

CERTIFICATE OF CORRECTION

PATENT NO. : 6,847,036 B1 Page 1 of 1
DATED : January 25, 2005
INVENTOR(S) : R.B. Darling et al.

It is certified that error appears in the above-identified patent and that said Letters Patent is hereby corrected as shown below:

Column 20,
Lines 59-67, double-indent the clause beginning "wherein"

Column 21,
Lines 1-3, 24-25, 26-29 and 30-35, double-indent the clause beginning "wherein"

Column 22,
Lines 13-14 and 15-18, double-indent the clause beginning "wherein"

Signed and Sealed this

Twenty-fourth Day of May, 2005

JON W. DUDAS
*Director of the United States Patent and Trademark Office*

UNITED STATES PATENT AND TRADEMARK OFFICE

CERTIFICATE OF CORRECTION

PATENT NO. : 6,847,036 B1
APPLICATION NO. : 09/744360
DATED : January 25, 2005
INVENTOR(S) : R. B. Darling et al.

It is certified that error appears in the above-identified patent and that said Letters Patent is hereby corrected as shown below:

| **COLUMN** | **LINE** | **ERROR** |
|---|---|---|
| 1 | 11 | after "spectrometry." insert the following heading and paragraph: --STATEMENT OF GOVERNMENT RIGHTS This invention was made with U.S. Government support under Grant Number BIR9214821AMO4, awarded by the National Science Foundation. The U.S. Government has certain rights in this invention.-- |

Signed and Sealed this

Thirty-first Day of March, 2009

JOHN DOLL

*Acting Director of the United States Patent and Trademark Office*